(12) United States Patent
Kawabata et al.

(10) Patent No.: US 8,530,752 B2
(45) Date of Patent: Sep. 10, 2013

(54) MULTILAYER CIRCUIT BOARD AND METHOD FOR MANUFACTURING THE SAME

(75) Inventors: Kenichi Kawabata, Tokyo (JP); Takaaki Morita, Tokyo (JP)

(73) Assignee: TDK Corporation, Tokyo (JP)

( * ) Notice: Subject to any disclaimer, the term of this patent is extended or adjusted under 35 U.S.C. 154(b) by 326 days.

(21) Appl. No.: 12/632,948

(22) Filed: Dec. 8, 2009

(65) Prior Publication Data

US 2010/0083490 A1    Apr. 8, 2010

Related U.S. Application Data

(62) Division of application No. 11/603,884, filed on Nov. 22, 2006, now Pat. No. 8,188,375.

(30) Foreign Application Priority Data

Nov. 29, 2005  (JP) .................................. 2005-343062
Jan. 12, 2006  (JP) .................................. 2006-004378

(51) Int. Cl.
    *H05K 1/16*    (2006.01)
(52) U.S. Cl.
    USPC ........................................................ 174/260
(58) Field of Classification Search
    USPC ................. 174/260, 261, 262; 361/721, 748,
              361/760, 761, 767, 776–778; 438/336, 458
    See application file for complete search history.

(56) References Cited

U.S. PATENT DOCUMENTS

| | | | |
|---|---|---|---|
| 5,103,293 A | 4/1992 | Bonafino et al. | 257/702 |
| 5,706,577 A | 1/1998 | Halstead | 29/827 |
| 6,197,407 B1 | 3/2001 | Andou et al. | 428/209 |
| 6,396,140 B1 | 5/2002 | Juneja et al. | 257/700 |
| 6,518,514 B2 * | 2/2003 | Suzuki et al. | 174/262 |
| 6,905,589 B2 * | 6/2005 | Egitto et al. | 205/125 |
| 7,208,832 B2 | 4/2007 | Yamagata | 257/701 |
| 7,394,663 B2 | 7/2008 | Yamashita et al. | 361/766 |
| 2004/0056344 A1 | 3/2004 | Ogawa et al. | 257/686 |
| 2004/0160752 A1 | 8/2004 | Yamashita et al. | 361/766 |

(Continued)

FOREIGN PATENT DOCUMENTS

| | | |
|---|---|---|
| EP | 0961533 A2 | 1/1999 |
| EP | 1460590 A2 | 2/2003 |

(Continued)

OTHER PUBLICATIONS

European Patent Office (EPO) Office Action dated May 4, 2010 (8 pages).

(Continued)

*Primary Examiner* — Jeremy Norris
*Assistant Examiner* — Tremesha S Willis
(74) *Attorney, Agent, or Firm* — Wolff Law Offices, PLLC; Kevin Alan Wolff

(57) ABSTRACT

A multilayer circuit board comprises core layers 101 and 102 made of a core material impregnated with resin, resin layers 111 and 112 interposed between the core layers 101 and 102, a wiring pattern 140 embedded in the resin layers 111 and 112. The core layers 101 and 102 have a thickness of 100 μm or smaller, whereby the entire board can significantly be thinned. Furthermore, the less strong resin layers 111 and 112 are interposed between the hard core layers 101 and 102, whereby the entire board has increased strength.

20 Claims, 43 Drawing Sheets

(56) References Cited

U.S. PATENT DOCUMENTS

| | | |
|---|---|---|
| 2004/0178482 A1 | 9/2004 | Bolken et al. |
| 2005/0017346 A1 | 1/2005 | Yamagata ............... 257/701 |
| 2005/0029642 A1 | 2/2005 | Takaya et al. ............ 257/678 |
| 2009/0061245 A1 | 3/2009 | Umeda .................... 428/483 |

FOREIGN PATENT DOCUMENTS

| | | |
|---|---|---|
| JP | 09-321408 | 12/1997 |
| JP | 2001-15912 | 1/2001 |
| JP | 2001-339165 | 12/2001 |
| JP | 2002-026171 | 1/2002 |
| JP | 2002-050874 | 2/2002 |
| JP | 2002-170840 | 6/2002 |
| JP | 2002-185139 | 6/2002 |
| JP | 2002-246500 | 8/2002 |
| JP | 2002-246507 | 8/2002 |
| JP | 2003-007896 | 1/2003 |
| JP | 2003-158239 | 5/2003 |
| JP | 2003-206451 | 7/2003 |
| JP | 2003-218490 | 7/2003 |
| JP | 2004-343021 | 12/2004 |
| JP | 2005-005548 | 1/2005 |
| JP | 2005-50997 | 2/2005 |
| JP | 2005-064470 | 3/2005 |
| JP | 2005-150417 | 6/2005 |
| JP | 2005-217372 | 8/2005 |
| JP | 2005-243999 | 9/2005 |

OTHER PUBLICATIONS

European Patent Office (EPO) Office Action dated Nov. 10, 2010 (7 pages).

European search report (See parent patent U.S. Appl. No. 11/603,884), Jan. 3, 2007.

\* cited by examiner

MULTILAYER CIRCUIT BOARD AND METHOD FOR MANUFACTURING THE SAME

This patent application is a divisional application of U.S. patent application Ser. No. 11/603,884 filed on Nov. 22, 2006 now U.S. Pat. No. 8,188 375, which is hereby incorporated herein for all purposes, and which claims priority to Japanese Patent Application No. 2005-343062 filed on Nov. 29, 2005 and Japanese Patent Application No. 2006-004378 filed on Jan. 12, 2006.

TECHNICAL FIELD

The present invention relates to a multilayer circuit board and a method for manufacturing the same, and particularly to a multilayer circuit board assuring reliable products and allowing the entire circuit board to have a smaller thickness and a method for manufacturing the same.

BACKGROUND OF THE INVENTION

A multilayer circuit board in which wiring patterns and semiconductor ICs are embedded usually has a thick core layer made of a core material such as a glass cloth impregnated with resin to prevent the board from being distorted or deformed in the course of production.

However, the core layer tends to increase the thickness of the multilayer circuit board. Therefore, demand for thinned is not fulfilled in some cases. A method to reduce the thickness of the entire board is to form a board using only thin resin layers and no core layer. In this way, the board is subject to significant distortion in the course of production. This distortion causes no problems when the pitches of embedded wiring patterns and semiconductor IC electrodes are sufficiently large. Conversely, it causes connection failures when their pitches are small.

In order to embed wiring patterns having smaller pitches in a board with no core layer, the production processes should proceed with the board immobilized on a support substrate so as to prevent the board from being distorted or deformed. Such techniques are disclosed in the Japanese Patent Application Laid Open Nos. 2005-150417 and 2005-243999. Techniques for embedding semiconductor ICs in a multilayer circuit board are described in the Japanese Patent Application Laid Open Nos. H9-321408, 2002-246500, 2001-339165, 2002-50874, 2002-170840, 2002-246507, 2003-7896, and 2005-64470.

However, the multilayer circuit board with no core layer is disadvantageously less strong and easily cracks. It is significantly difficult in the prior art to reduce the thickness of the entire board while assuring reliable products.

SUMMARY OF THE INVENTION

The present invention is proposed to resolve these problems. Therefore, an object of the present invention is to provide a multilayer circuit board assuring reliable products and allowing the entire circuit board to have a smaller thickness and a method for manufacturing the same.

Another object of the present invention is to provide a semiconductor IC-embedded multilayer circuit board assuring reliable products and allowing the entire circuit board to have a smaller thickness and a method for manufacturing the same.

The multilayer circuit board according to the present invention comprises first and second core layers including a core material impregnated with resin, at least one resin layer interposed between the first and second core layers, and wiring patterns embedded in the resin layer.

In the present invention, with the two core layers having a thickness of 100 µm or smaller, the entire board can have a sufficiently small thickness. The entire board also has increased strength because the less strong resin layer is interposed between the hard core layers. Usually, a core layer made of a core material impregnated with resin is subject to almost no deformation in the course of production. However, even this hard core layer is subject to measurable deformation when it has a thickness reduced to 100 µm or smaller. Such a deformation can be prevented by immobilizing the first and second core layers on a support substrate during the production.

The multilayer circuit board of the present invention preferably further comprises a semiconductor IC embedded in the resin layer. In such a case, preferably, said at least one resin layer includes a first resin layer contacting a main surface of the semiconductor IC and a second resin layer covering a rear surface of the semiconductor IC, the semiconductor IC has conductive protrusions formed on the main surface thereof, and the conductive protrusions protrudes from a surface of the first resin layer. A die attach film can be provided on the rear surface of the semiconductor IC. In such a case, the rear surface of the semiconductor IC is covered with the second resin layer via the die attach film. The semiconductor IC is preferably thinned.

The method for manufacturing the multilayer circuit board of the present invention comprises a first step of immobilizing a first core layer including a core material impregnated with resin on a first support substrate, a second step of forming at least one resin layer in which wiring patterns are embedded on the first core layer, and a third step of forming a second core layer including a core material impregnated with resin on the resin layer.

According to the present invention, the first core layer is immobilized on the first support substrate before the following steps are performed. Therefore, even though the first core layer has a significantly small thickness of 100 µm or smaller, the core layer is prevented from being deformed in a process that otherwise likely causes deformation, such as a wet process. Here, when the two core layers are provided on either side of the resin layer and each core layer has a thickness of larger than 100 µm, the deformation in the course of production is sufficiently small compared to the pitches of wiring patterns and semiconductor IC electrodes. Therefore, immobilization on a support substrate is unnecessary. On the other hand, when the core layer has a thickness of 100 µm or smaller, the deformation in the course of production is not negligible in view of the pitches of wiring patterns and semiconductor IC electrodes. Therefore, the immobilization on a support substrate is significantly important.

The first support substrate and first core layer are preferably attached to each other by a first heat release sheet. In this way, they can easily be detached.

The method for manufacturing the multilayer circuit board of the present invention preferably further comprises a fourth step of forming through-holes in the first core layer. In such a case, the fourth step can be performed after the first support substrate is detached or before the second step. In addition, the method also preferably further comprises a fifth step of forming through-holes in the second core layer after the third step.

The method for manufacturing the multilayer circuit board of the present invention also preferably further comprises a sixth step of immobilizing the second core layer on a second support substrate before the first support substrate is detached from the first core layer. In this way, the core layers are immobilized on the support substrates in more processes, whereby the deformation can be more effectively prevented.

The second support substrate and second core layer are preferably attached to each other by a second heat release sheet. It is preferable that the second heat release sheet has a higher release temperature than the first heat release sheet. In this way, the first and second heat release sheets can selectively be released.

Furthermore, it is preferable that a semiconductor IC is embedded in the resin layer in the second step. In such a case, the second step preferably includes the following steps: forming a first resin layer on the first core layer, mounting a semiconductor IC on the first resin layer with its rear surface facing the first resin layer, forming a second resin layer to cover the main surface of the semiconductor IC, and reducing the thickness of the second resin layer so that conductive protrusions on the main surface of the semiconductor IC protrude from one surface of the second resin layer. By reducing the thickness of the entire second resin layer using, for example, a wet blast technique to let the conductive protrusions protrude, the heads of the conductive protrusions are properly exposed even if the electrode pitches are small. In addition, the head exposure takes only a short time regardless of the number of the conductive protrusions. Furthermore, no smear occurs as in the case very small vias are formed using laser irradiation. Therefore, desmear treatment can be eliminated.

As described above, according to the present invention, the less strong resin layer is interposed between the strong core layers, whereby a thin and strong structure can be obtained by sufficiently reducing the thickness of the core layers. In other words, the entire substrate can have a small thickness while assuring reliable products.

The core layers are immobilized on a support substrate in the course of production; therefore, the distortion can be effectively prevented even if the core layers are sufficiently thin. In this way, fine wiring patterns and semiconductor ICs with small pitches of electrodes can be embedded.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
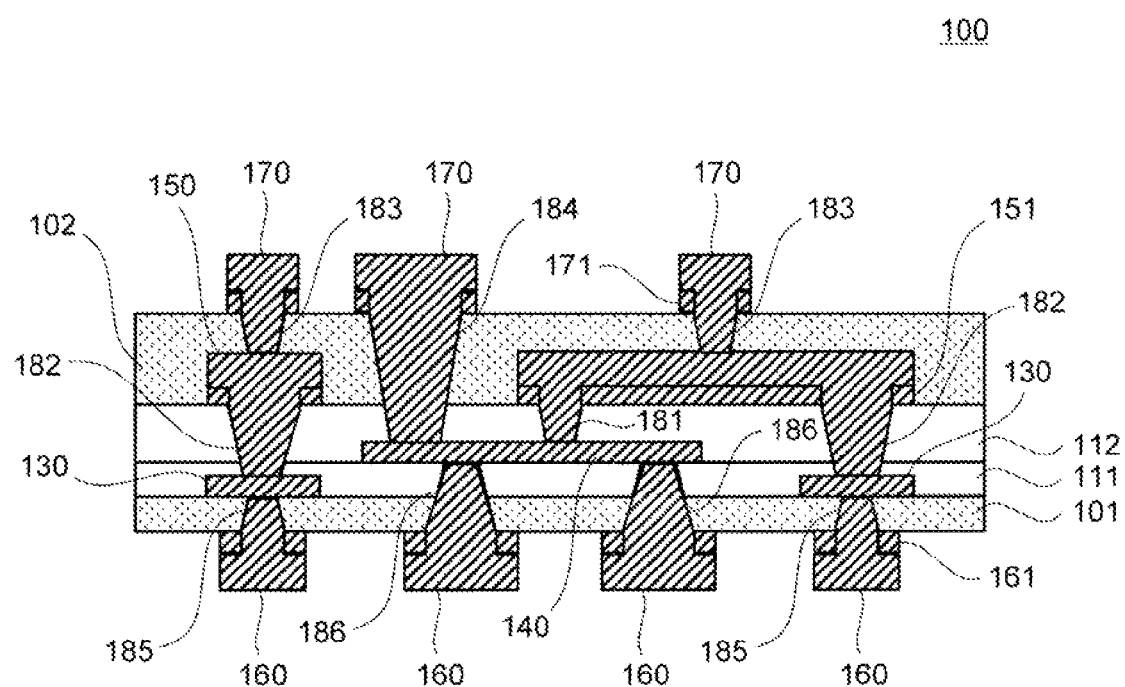
FIG. 1 is a schematic sectional view showing the structure of a multilayer circuit board according to a first preferred embodiment of the present invention.

FIG. 1 is a schematic sectional view showing the structure of a multilayer circuit board 100 according to a first preferred embodiment of the present invention.

As shown in FIG. 1, the multilayer circuit board 100 of this embodiment includes outermost core layers 101 and 102, resin layers 111 and 112 positioned between the core layers 101 and 102, wiring patterns 130, 140, 150, 160, and 170, and through electrodes 181 to 186. Among them, the wiring pattern 130 is embedded between the core layer 101 and the resin layer 111; the wiring pattern 140 is embedded between the resin layers 111 and 112; and the wiring pattern 150 is embedded between the resin layer 112 and the core layer 102. The wiring pattern 160 is formed on the surface of the core layer 101 and the wiring pattern 170 is formed on the surface of the core layer 102. Passive components such as capacitors can be mounted at least either one of the outermost wiring patterns 160 and 170, which is not shown in FIG. 1.

As shown in FIG. 1, the through electrode 181 connects the wiring patterns 140 and 150; the through electrode 182 connects the wiring patterns 130 and 150; the through electrode 183 connects the wiring patterns 150 and 170; the through electrode 184 connects the wiring patterns 140 and 170; the through electrode 185 connects the wiring patterns 130 and 160; and the through electrode 186 connects the wiring patterns 140 and 160. In this way, the multilayer circuit board 100 of the present embodiment has multiple through electrodes having different depths.

Metal masks 151, 161, and 171 remain under the wiring patterns 150, 160, and 170, respectively. These metal masks 151, 161, and 171 are the remaining portions of the masks used for forming the through electrodes 181 to 186, which is described later.

The resin layers 111 and 112 can be made of thermosetting or thermoplastic resins as long as the material has reflow durability. Specifically, the material can be selected from epoxy resin, bismaleimide-triazine resin (BT resin), phenol resin, vinyl benzyl resin, polyphenylene ether (polyphenylene ether oxide) resin (PPE, PPO), cyanate resin, benzoxazine resin, polyimide resin, aromatic polyester resin, polyphenylene sulfide resin, polyether imide resin, polyallylate resin, and polyetheretherketone resin. These resins can be combined with fillers.

The core layers 101 and 102 are made of a core material, for example, resin cloth such as glass cloth, PPTA [poly (p-) phenylele terephtalamide) fiber], and liquid crystal polymers, nonwoven cloth such as aramid and aromatic polyester, and porous sheets such as fluorine resin, impregnated with thermosetting or thermoplastic resin. Therefore, the core layers 101 and 102 are much stronger than the resin layers 111 and 112. In the present invention, the core layers 101 and 102 have a thickness of 100 μm or smaller and preferably 60 μm or smaller, which is much smaller than conventional core layers. In this embodiment, the core layers 101 and 102 serve as the outermost layers of the multilayer circuit board 100 and the less strong resin layers 111 and 112 are interposed between them. Therefore, the entire thickness can sufficiently be reduced while assuring high strength.

The core layer made of a core material impregnated with resin is generally subject to almost no distortion in the course of production. Therefore, the core layer can be used as a support substrate and resin build-up layers are formed on the top and bottom surfaces thereof to produce a multilayer circuit board. However, the core layers of this embodiment are very thin and have a thickness of 100 μm or smaller. They are subject to measurable distortion in the course of production like conventional resin layers with no core material. In order to prevent such a distortion, support substrates are prepared separately from the core board in this embodiment. The core layers are immobilized on the support substrates in the course of production.

The method for manufacturing the multilayer circuit board 100 shown in FIG. 1 is described hereafter with reference to the drawings.

FIGS. 2 to 25 are process diagrams used to describe the method for manufacturing the multilayer circuit board 100 shown in FIG. 1.

Figure 2:
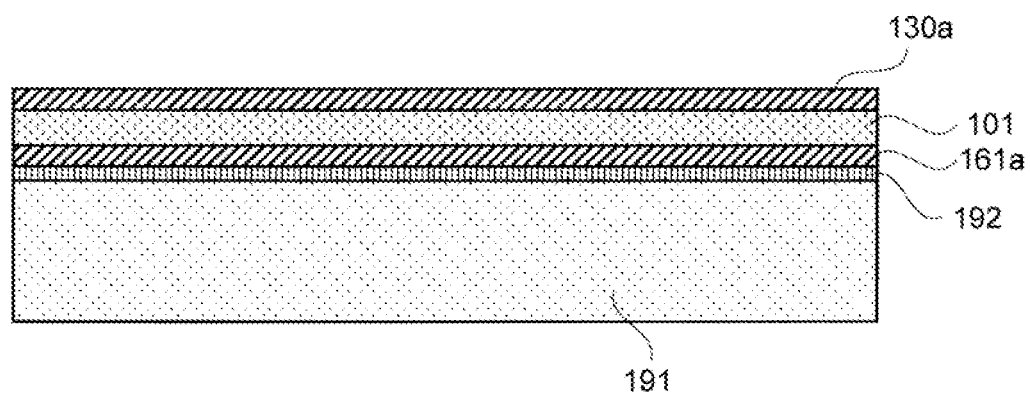
FIG. 2 is process diagram showing a process of affixing a support substrate that is a part of the manufacturing process of the multilayer circuit board shown in FIG. 1.

First, as shown in FIG. 2, a core layer 101 having conductive layers 130a and 161a formed on either side is prepared and attached to a support substrate 191. In the present embodiment, a heat release sheet 192 is used to attach the support substrate 191. The heat release sheet 192 exhibits reduced adhesion under heat and, therefore, the support substrate 191 is easily released. The material of the support substrate 191 is not particularly restricted. For example, nickel (Ni) and stainless can be used. The thickness of the support substrate 191 is not particularly restricted as long as a required mechanical strength is assured. For example, the thickness can be approximately 50 to 2000 μm. On the other hand, the thickness of the core layer 101 is 100 μm or smaller and preferably 60 μm or smaller as described above.

Figure 3:
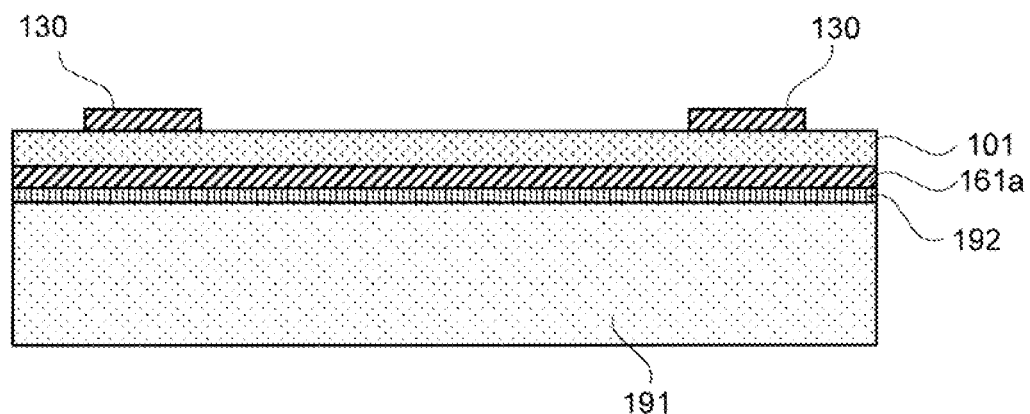
FIG. 3 is process diagram showing a process of forming a wiring pattern that is a part of the manufacturing process of the multilayer circuit board shown in FIG. 1.

Then, as shown in FIG. 3, the conductive layer 130a is patterned to form a wiring pattern 130. An etching solution such as ferric chloride can be used to pattern the conductive layer 130a. Here, the core layer 101 is subject to deformation because of differences in physical properties from the copper foil, release of stress generated during the pre-preg preparation, vertical and horizontal anisotropies of the core material, and a small amount of water absorption during the patterning. However, in this embodiment, the core layer 101 is attached to the support substrate 191, whereby the deformation is minimized.

Figure 4:
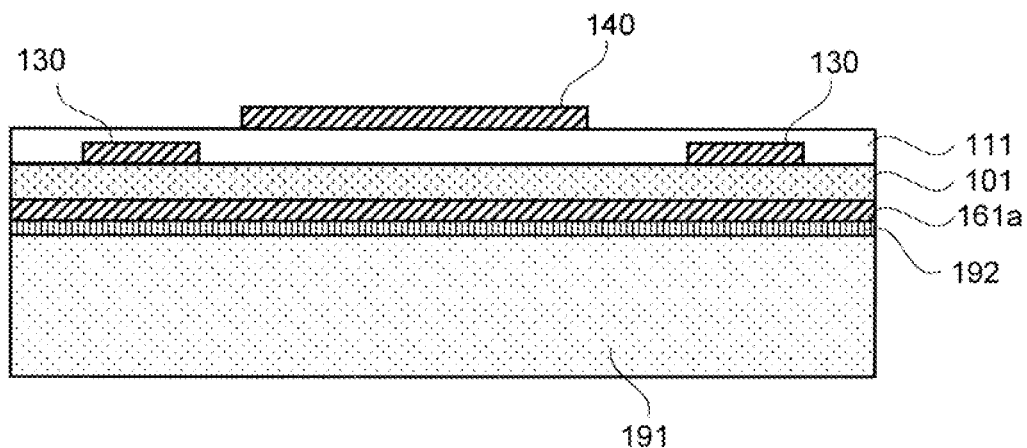
FIG. 4 is process diagram showing a process of forming a resin layer and a wiring pattern that is a part of the manufacturing process of the multilayer circuit board shown in FIG. 1.

Then, as shown in FIG. 4, a resin layer 111 is formed to cover the core layer 101 and wiring pattern 130 and a wiring pattern 140 is formed on the surface of the resin layer 111. Here, the resin layer 111 and wiring pattern 140 are formed by pressing a laminated sheet of an uncured or partially cured resin layer and a conductive layer under heat and then patterning the conductive layer. During the pressing, the core layer 101 receives high pressure and the resin flows horizontally or the resin flows to smooth the rough surface generated during the patterning. All these cause the deformation. However, the deformation is minimized as a result of the immobilization on the support substrate 191.

Figure 5:
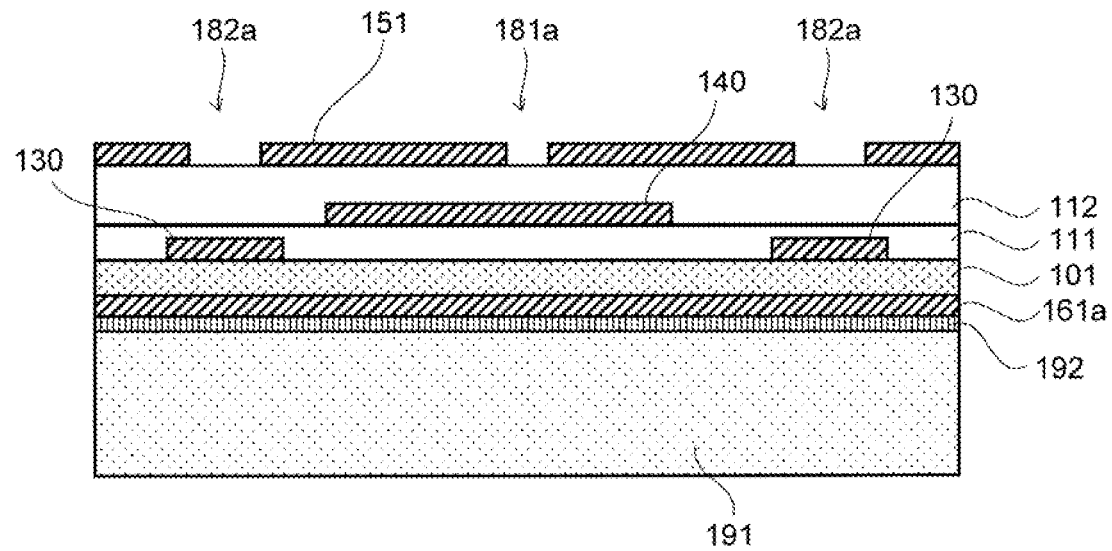
FIG. 5 is process diagram showing a process of forming a resin layer and a metal mask that is a part of the manufacturing process of the multilayer circuit board shown in FIG. 1.

Then, as shown in FIG. 5, a resin layer 112 is formed to cover the resin layer 111 and wiring pattern 140 and a metal mask 151 is formed on the surface of the resin layer 112. Here again, the resin layer 112 and metal mask 150 are formed, for example, by pressing a laminated sheet of an uncured or partially cured resin layer and a conductive layer under heat and then patterning the conductive layer. The deformation that possibly occurs in this pressing is also minimized as a result of the immobilization on the support substrate 191.

As shown in FIG. 5, the metal mask 151 has a plurality of through-holes 181a and 182a. The through-holes 181a and 182a are provided at positions where through electrodes 181 and 182 are to be formed. The diameters of the through-holes 181a and 182a are preferably 30 to 200 μm although they are not particularly restricted. In this embodiment, the through-holes 181a and 182a have different diameters according to the depths of through-holes to be formed. The through-hole 181a for which a shallow through-hole is formed has a relatively small diameter and the through-hole 182a for which a deep through-hole is formed has a relatively large diameter.

Figure 6:
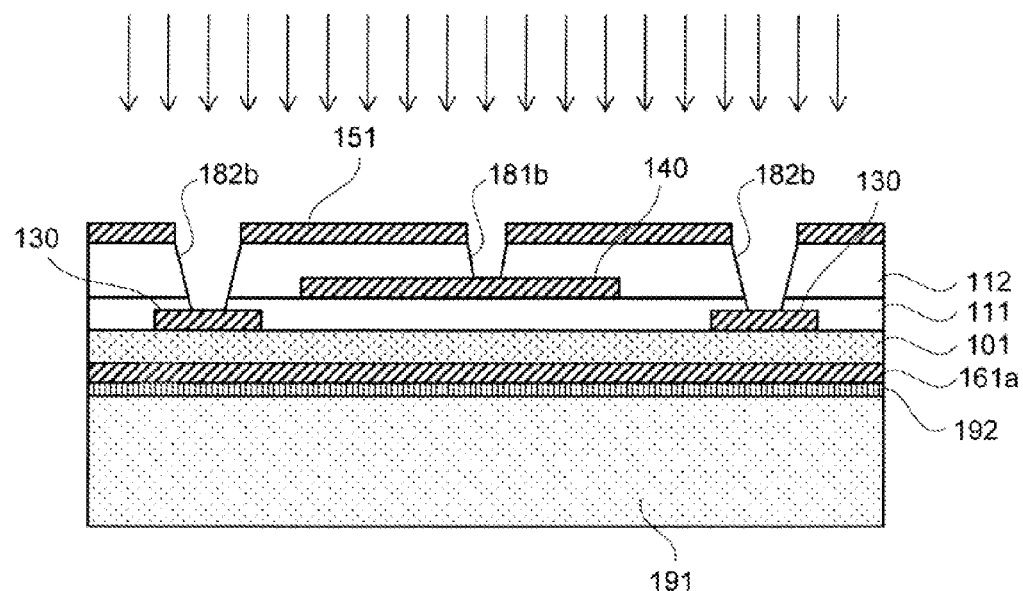
FIG. 6 is process diagram showing a process of forming through-holes that is a part of the manufacturing process of the multilayer circuit board shown in FIG. 1.

Then, as shown in FIG. 6, through holes 181b and 182b are formed by sand blasting using the metal mask 151 as a mask. In the sandblasting, non-metal or metal particles are ejected to the processing object to abrade it. The wiring patterns 130 and 140 directly below the through-holes 181a and 182a serve as a stopper. Then, the through-holes having different depths can be formed. Furthermore, the through-holes 181a and 182 have different diameters according to the depths of the through-holes 181b and 182b, assuring sufficient diameters at the bottoms of the through-holes.

Figure 7:
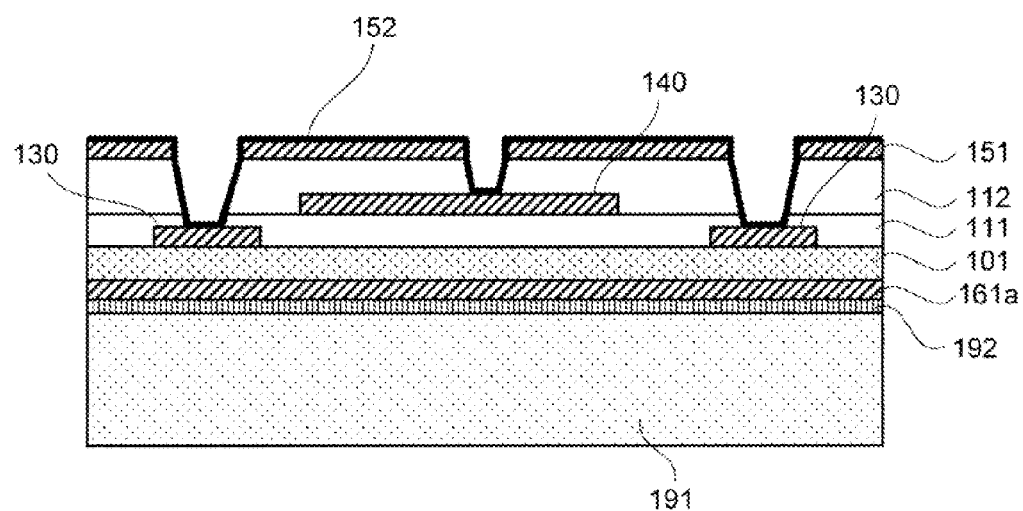
FIG. 7 is process diagram showing a process of forming a base conductor layer that is a part of the manufacturing process of the multilayer circuit board shown in FIG. 1.

Then, as shown in FIG. 7, a thin base conductor layer 152 is formed on the entire surface of the resin layer 112 including the insides of the through-holes 181b and 182b by a vapor growth method such as sputtering. Consequently, the portions of the wiring pattern 130 that are exposed at the bottoms of the through-holes 182b and the portions of the wiring pattern 140 that are exposed at the bottoms of the through-holes 181b are directly covered with the base conductor layer 152. Here, the base conductor layer 152 can be formed by electroless plating or vapor deposition instead of a vapor growth method. Unnecessary portions of the base conductor layer 152 will be removed later. Therefore, the base conductor layer 152 should have a sufficiently small thickness and preferably a thickness of approximately 0.005 to 3 µm, for example, 0.3 to 2 µm.

Figure 8:
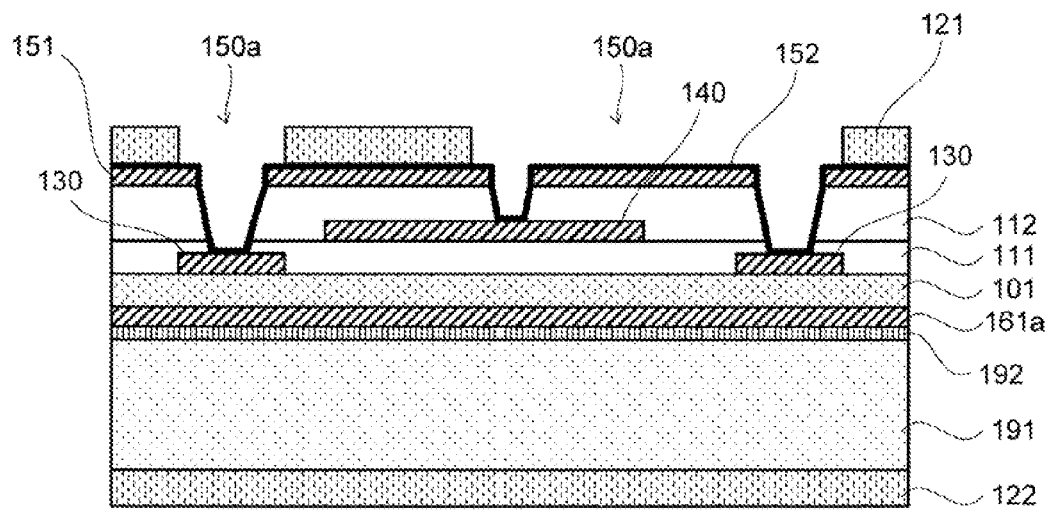
FIG. 8 is process diagram showing a process of forming dry films that is a part of the manufacturing process of the multilayer circuit board shown in FIG. 1.
Figure 9:
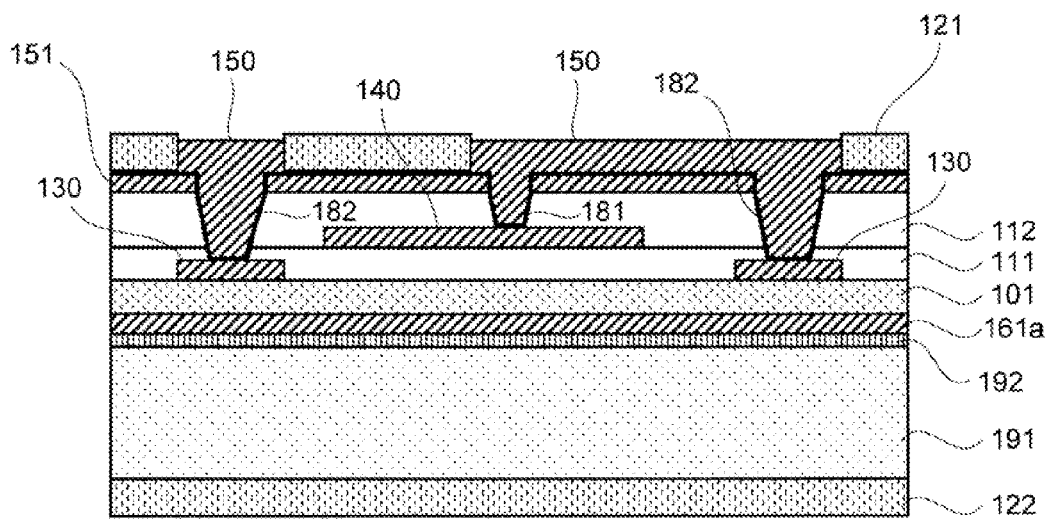
FIG. 9 is process diagram showing a process of forming a wiring pattern that is a part of the manufacturing process of the multilayer circuit board shown in FIG. 1.

Then, as shown in FIG. 8, photosensitive dry films 121 and 122 are applied to either side of the board, in other words, to the surface of the base conductor layer 152 and the surface of the support substrate 191. Subsequently, the dry film 121 is exposed using a not-shown photo-mask to remove it in areas 150a where wiring pattern 150 is formed. Now, the base conductor layer 152 is exposed in the areas 150a where wiring pattern 150 is to be formed.

Here, the dry film 122 is not removed and the entire surface of the support substrate 191 is kept substantially covered. The dry film 121 should have a slightly larger thickness than the wiring pattern 150. For example, the dry film 121 has a thickness of approximately 25 µm when the wiring pattern 150 has a thickness of approximately 20 µm. On the other hand, the dry film 122 is provided to protect the surface of the support substrate 191 from being plated. It can have any thickness.

After partially exposed as described above, the base conductor layer 152 is subject to electrolytic plating to form the wiring pattern 150 in the areas 150a where the base conductor layer 152 is exposed. In addition, the through-holes 181b and 182b are filled with through electrodes 181 and 182. Consequently, the through electrode 181 penetrates the resin layer 112, whereby the wiring patterns 140 and 150 are connected via the through electrode 181. Similarly, the through electrode 182 penetrates the resin layers 111 and 112, whereby the wiring patterns 130 and 150 are connected via the through electrode 182. The entire surface of the support substrate 191 is substantially covered with the dry film 122 so that it is not plated.

The plating solution can be selected as appropriate according to the materials of the wiring pattern 150 and through electrodes 181 and 182. For example, the plating solution can be a copper sulfate bath when these components are made of copper (Cu).

Figure 10:
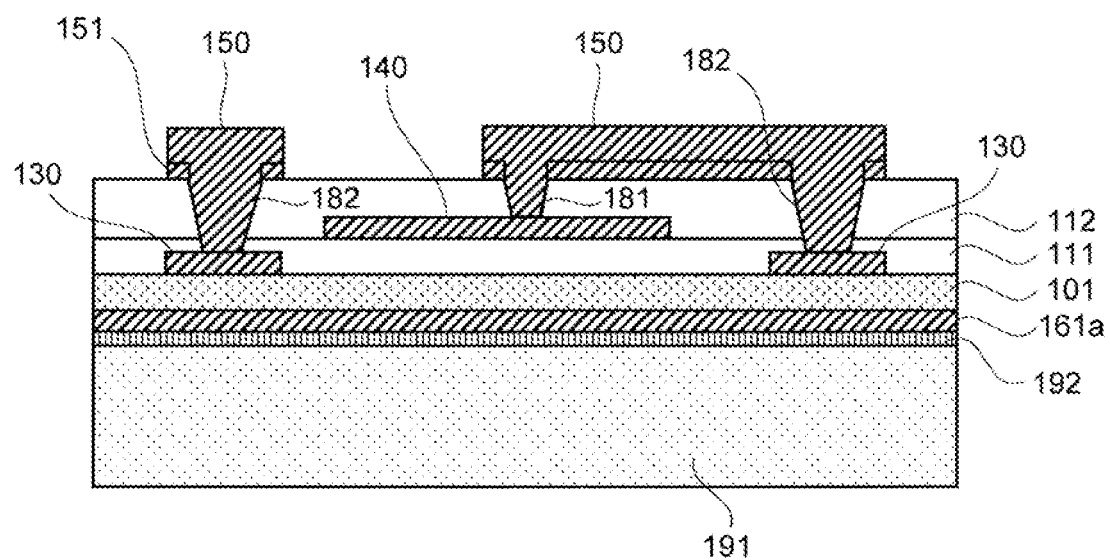
FIG. 10 is process diagram showing a process of removing the base conductor layer and the metal mask that is a part of the manufacturing process of the multilayer circuit board shown in FIG. 1.

Then, as shown in FIG. 10, the dry films 121 and 122 are removed. Furthermore, unnecessary portions of the base conductor layer 152 and metal mask 151 where the wiring pattern 150 is not formed are removed (soft-etched) using an etching solution such as an acid.

Figure 11:
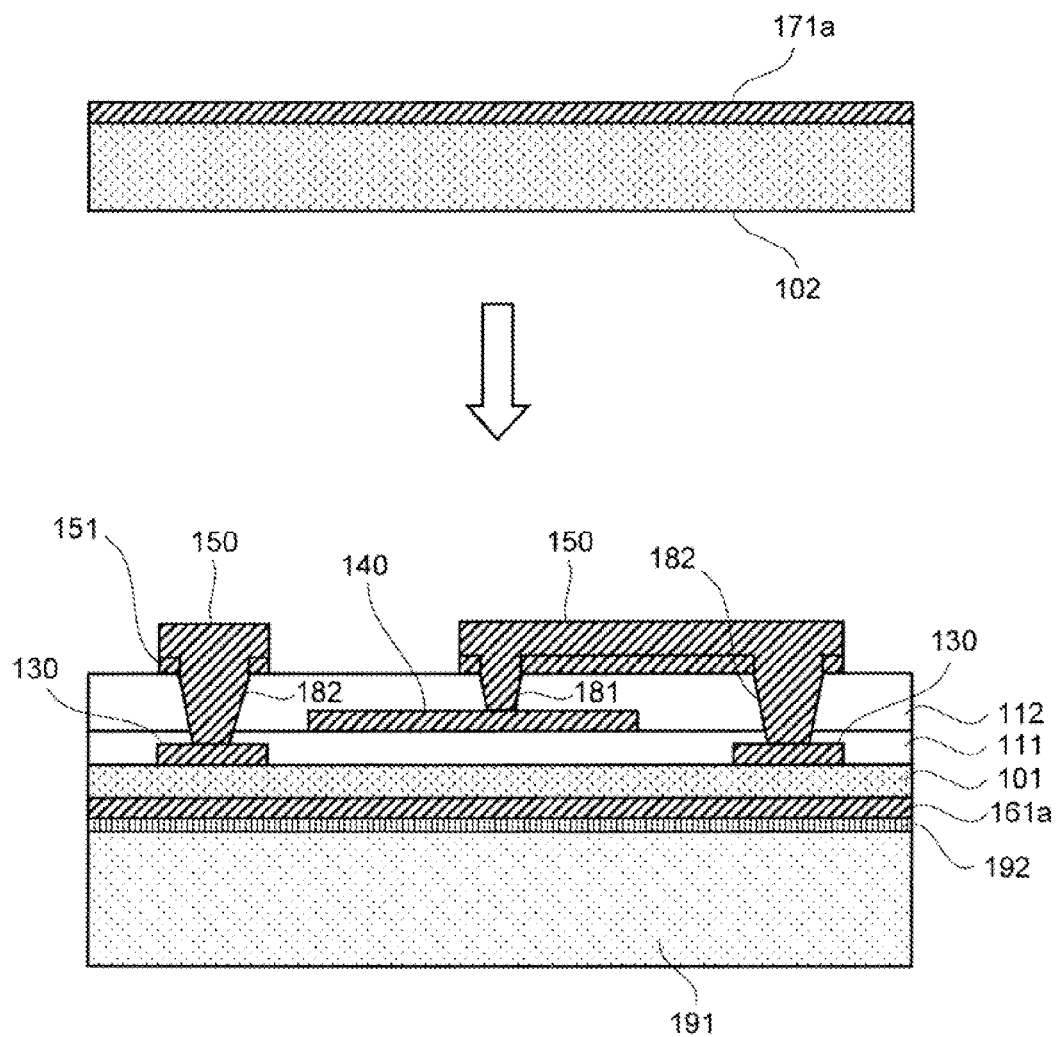
FIG. 11 is process diagram showing a process of pressing a core layer (before pressing) that is a part of the manufacturing process of the multilayer circuit board shown in FIG. 1.
Figure 12:
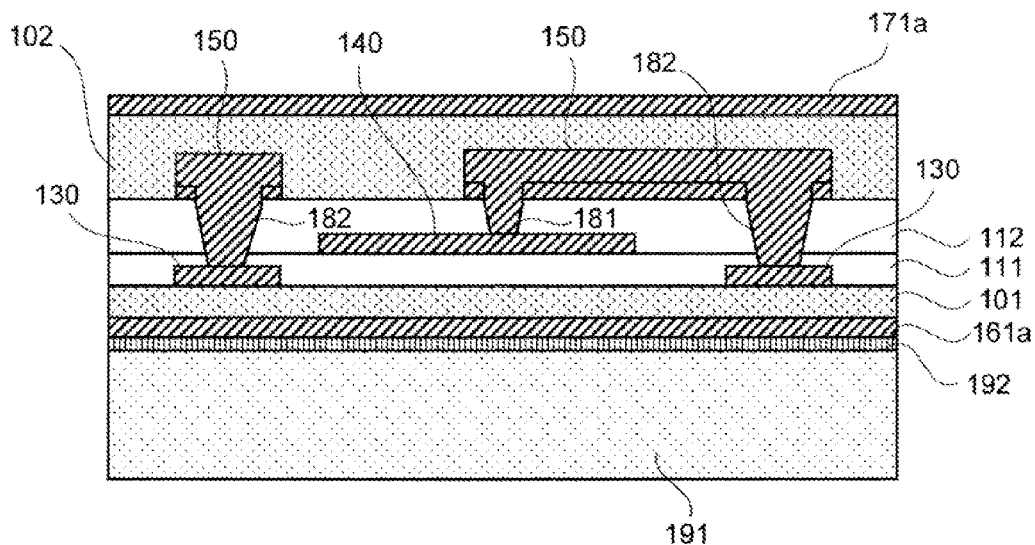
FIG. 12 is process diagram showing a process of pressing a core layer (after pressing) that is a part of the manufacturing process of the multilayer circuit board shown in FIG. 1.

Then, as shown in FIG. 11, a laminated sheet of a core layer 102 and a conductive layer 171a is pressed and heated. Consequently, as shown in FIG. 12, the wiring pattern 150 and resin layer 112 are covered with the core layer 102. As described above, during this pressing, the core layer 101 receives high pressure and the resin flows horizontally or the resin flows to smooth the rough surface generated during the patterning; all these cause the deformation. However, the deformation is minimized as a result of the immobilization on the support substrate 191.

Figure 13:
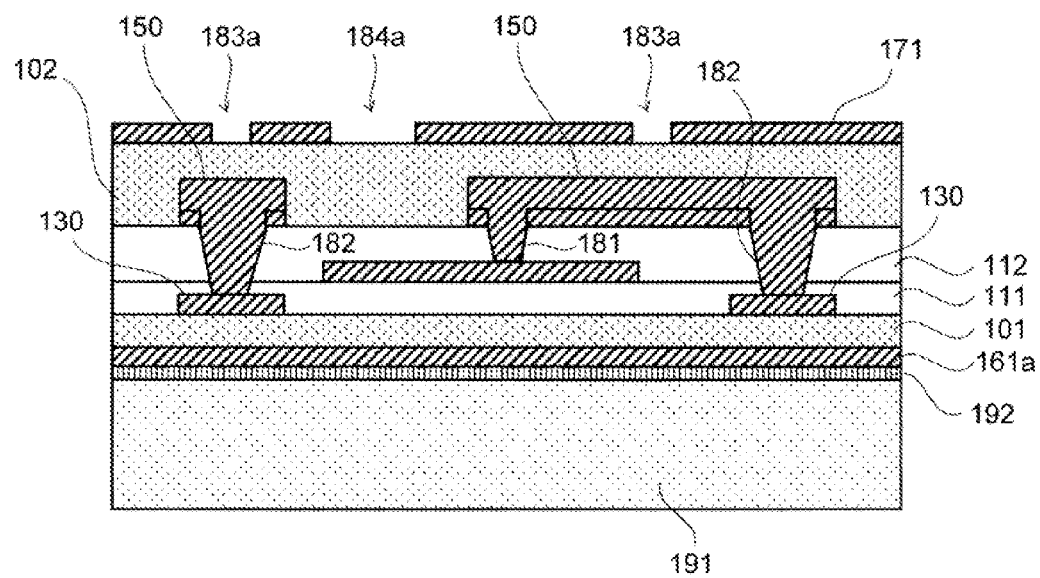
FIG. 13 is process diagram showing a process of forming a metal mask that is a part of the manufacturing process of the multilayer circuit board shown in FIG. 1.

Then, as shown in FIG. 13, the conductive layer 171a is patterned to form a metal mask 171. The metal mask 171 has multiple through-holes 183a and 184a. The through-holes 183a and 184a are provided at positions where through electrodes 183 and 184 are to be formed. Here again, the through-hole 183a for which a shallow through-hole is formed has a relatively small diameter and the through-hole 184a for which a deep through-hole is formed has a relatively large diameter.

Figure 14:
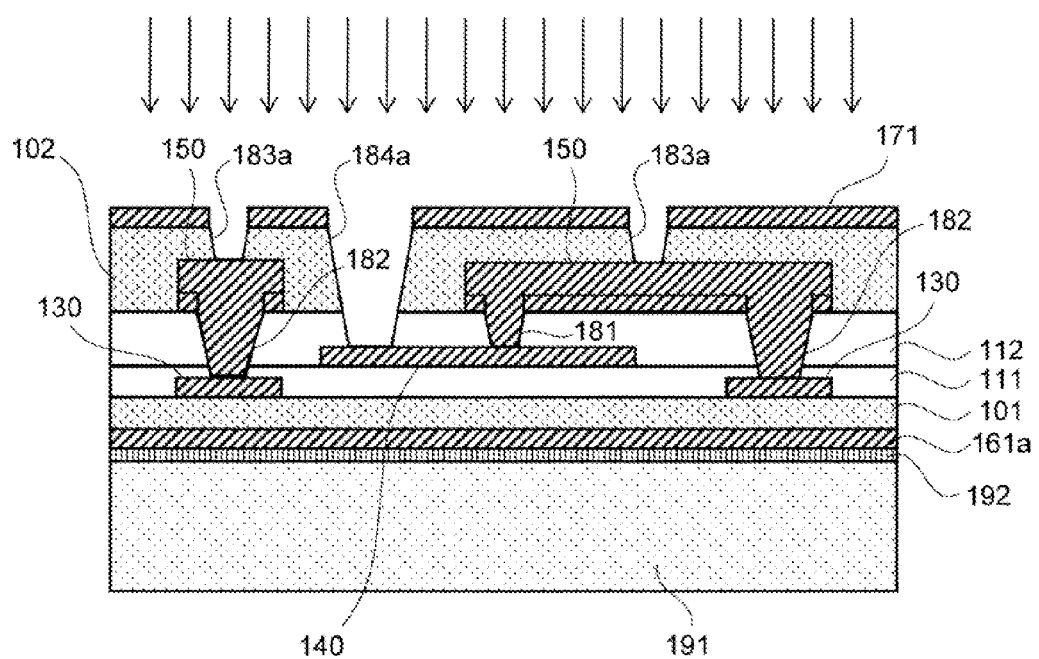
FIG. 14 is process diagram showing a process of forming through-holes that is a part of the manufacturing process of the multilayer circuit board shown in FIG. 1.

Then, as shown in FIG. 14, through holes 183b and 184b are formed by sand blasting using the metal mask 171 as a mask. Here again, the wiring patterns 140 and 150 directly below the through-holes 183a and 184a serve as a stopper. Then, the through-holes having different depths can be formed. Furthermore, the through-holes 183a and 184a have different diameters according to the depths of the through-holes 183b and 184b, assuring sufficient diameters at the bottoms of the through-holes.

Figure 15:
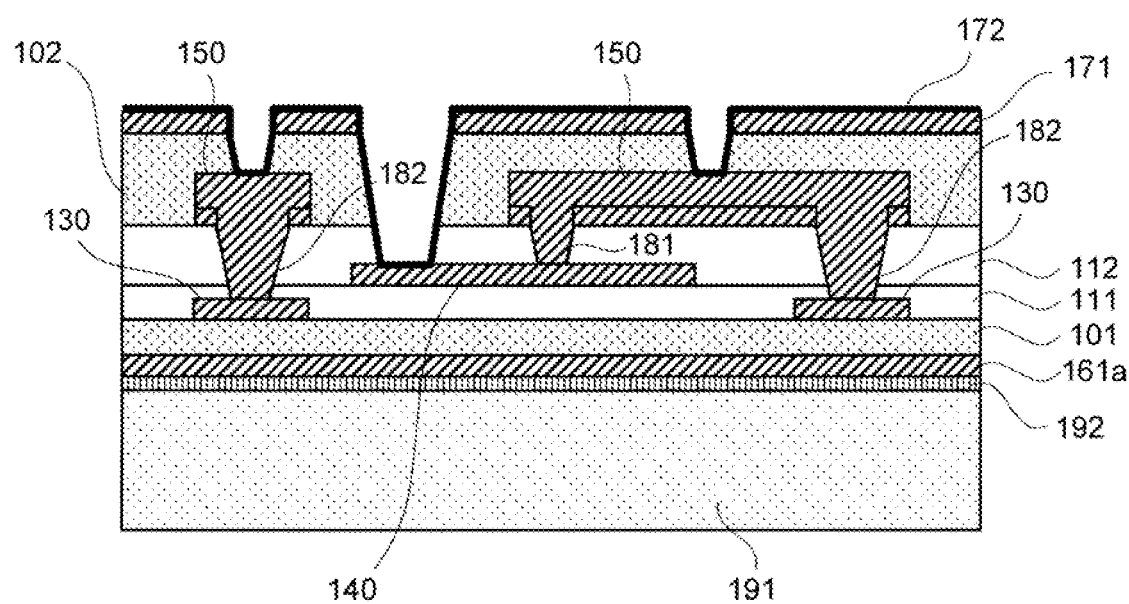
FIG. 15 is process diagram showing a process of forming a base conductor layer that is a part of the manufacturing process of the multilayer circuit board shown in FIG. 1.

Then, as shown in FIG. 15, a thin base conductor layer 172 is formed on the entire surface of the core layer 102 including the insides of the through-holes 183b and 184b by a vapor growth method. Consequently, the portions of the wiring pattern 140 that are exposed at the bottoms of the through-holes 184b and the portions of the wiring pattern 150 that are exposed at the bottoms of the through-holes 183b are directly covered with the base conductor layer 172.

Figure 16:
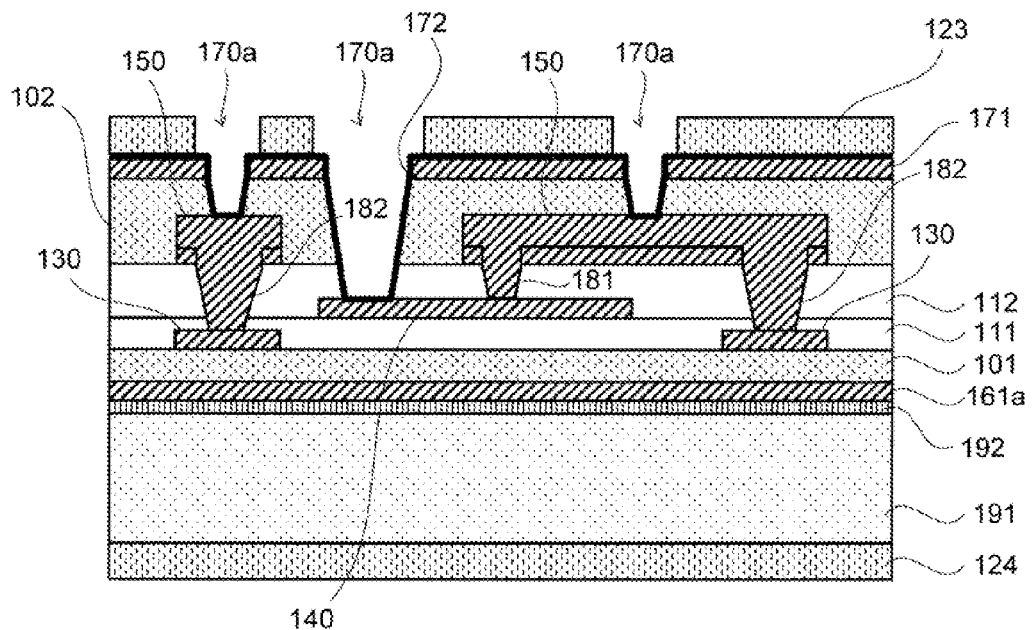
FIG. 16 is process diagram showing a process of affixing and exposing dry films that is a part of the manufacturing process of the multilayer circuit board shown in FIG. 1.

Then, as shown in FIG. 16, photosensitive dry films 123 and 124 are applied to either side of the board, in other words, to the surface of the base conductor layer 172 and the surface of the support substrate 191. Subsequently, the dry film 123 is exposed using a not-shown photo-mask to remove it in areas 170a where a wiring pattern 170 is to be formed. Now, the base conductor layer 172 is exposed in the areas 170a where the wiring pattern 170 is to be formed. Here, the dry film 124 is not removed and the entire surface of the support substrate 191 is kept substantially covered.

After partially exposed as described above, as shown in FIG. 17, the base conductor layer 172 is subject to electrolytic plating to form the wiring pattern 170 in the areas 170a where the base conductor layer 152 is exposed. In addition, the through-holes 183b and 184b are filled with through electrodes 183 and 184. Consequently, the through electrode 183 penetrates the core layer 102, whereby the wiring patterns 150 and 1750 are connected via the through electrode 183. Similarly, the through electrode 184 penetrates the core layer 102 and resin layer 112, whereby the wiring patterns 140 and 170 are connected via the through electrode 184. The entire surface of the support substrate 191 is substantially covered with the dry film 124 so that it is not plated.

Figure 18:
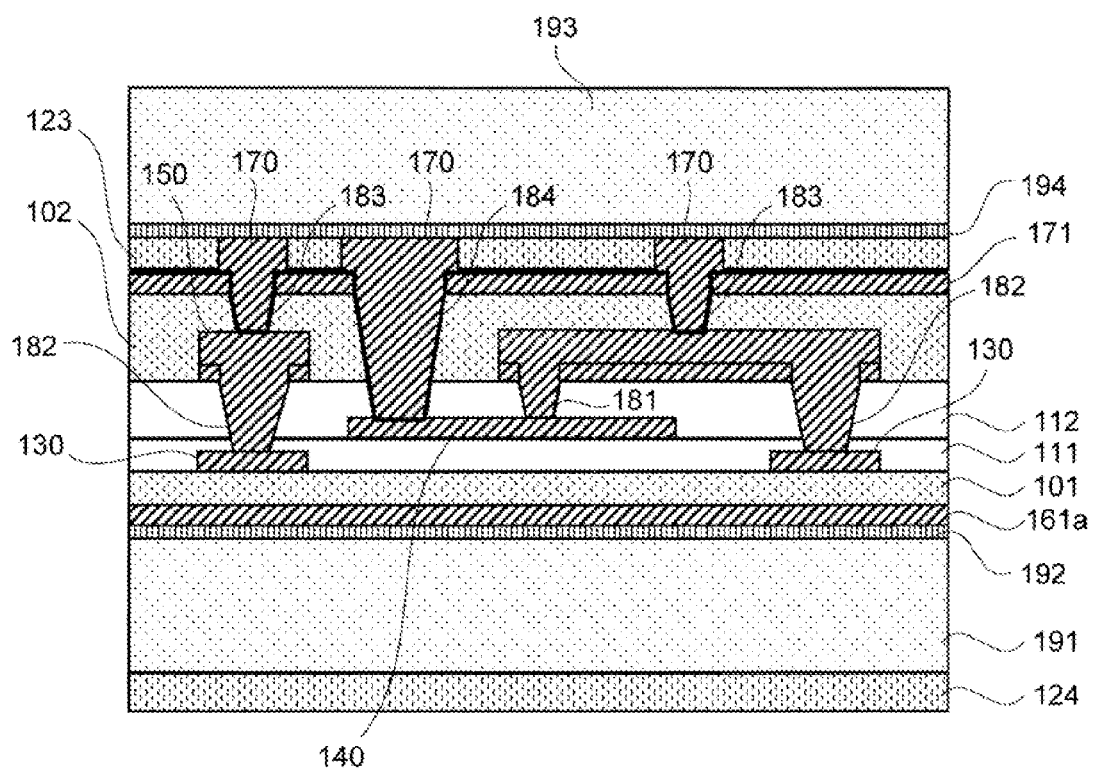
FIG. 18 is process diagram showing a process of affixing a support substrate that is a part of the manufacturing process of the multilayer circuit board shown in FIG. 1.
Figure 19:
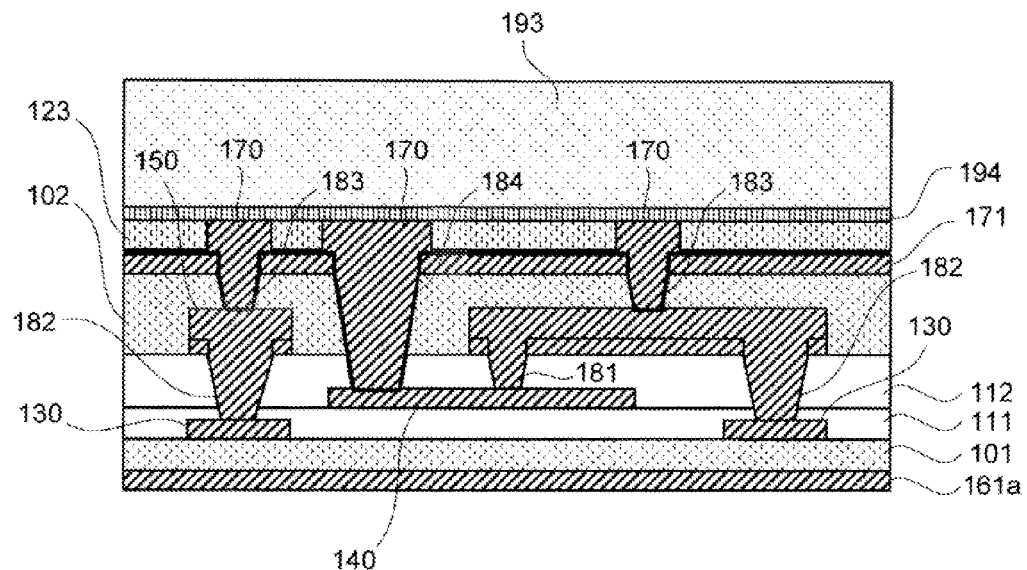
FIG. 19 is process diagram showing a process of peeling off a support substrate that is a part of the manufacturing process of the multilayer circuit board shown in FIG. 1.

Then, as shown in FIG. 18, another support substrate 193 is attached to the surface opposite to the support substrate 191. A heat release sheet 194 is again used to attach the support substrate 193. After the other support substrate 193 is attached, as shown in FIG. 19, the first support substrate 191 is released. The support substrate 191 is released by heating the heat release sheet 192.

In order for the support substrate 193 attached later not to be released under heat, the heat release sheets 192 and 194 satisfying the following expression can be used in which T1 is the release temperature of the heat release sheet 192 and T2 is the release temperature of the heat release sheet 194:

$$T1<T2.$$

A temperature Tx applied to release the support substrate 191 is set for:

$$T1 \leq Tx < T2.$$

In this way, only the support substrate 191 attached earlier is released without releasing the support substrate 193 attached later.

Figure 20:
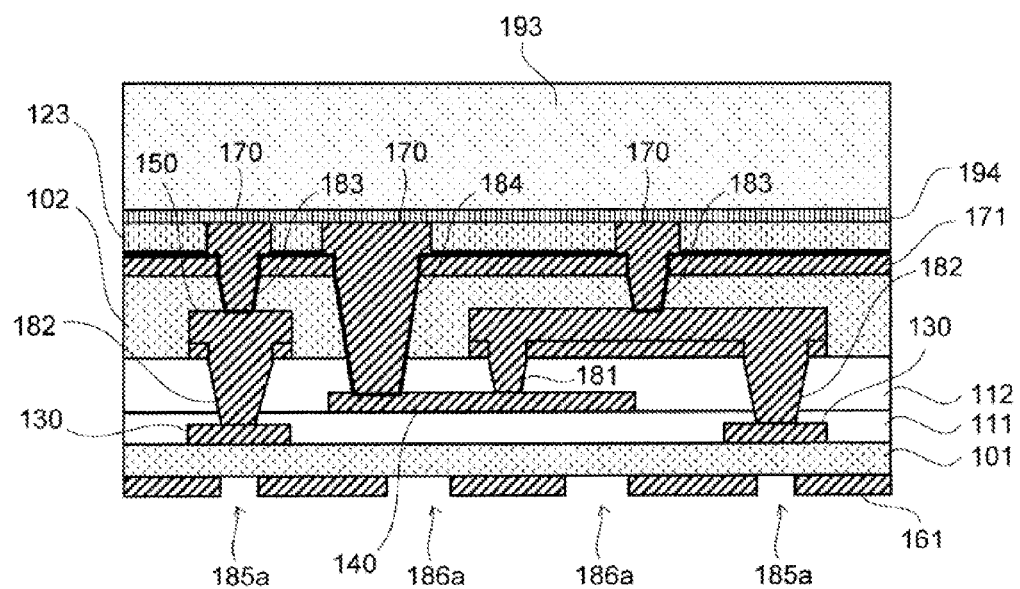
FIG. 20 is process diagram showing a process of forming a metal mask that is a part of the manufacturing process of the multilayer circuit board shown in FIG. 1.

Then, as shown in FIG. 20, the conductive layer 161a is patterned to form a metal mask 161. The metal mask 161 has multiple through-holes 185a and 186a. The through-holes 185a and 186a are provided at positions where through electrodes 185 and 186 are to be formed. Here again, the through-hole 185a for which a shallow through-hole is formed has a relatively small diameter and the through-hole 186*a* for which a deep through-hole is formed has a relatively large diameter.

Figure 21:
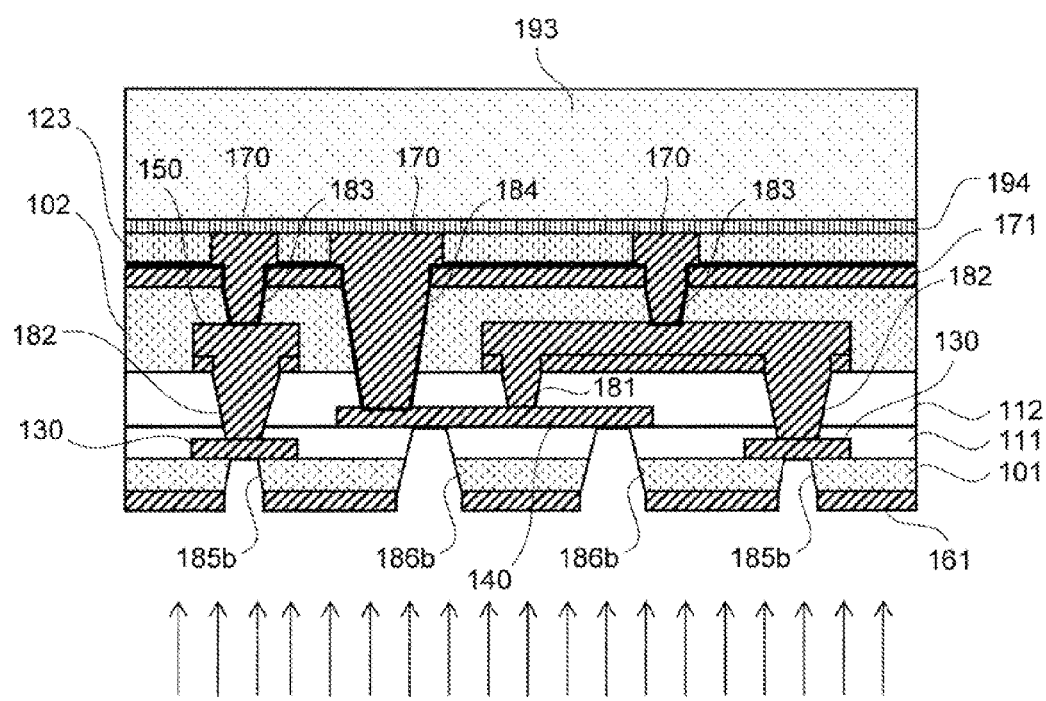
FIG. 21 is process diagram showing a process of forming through-holes that is a part of the manufacturing process of the multilayer circuit board shown in FIG. 1.

Then, as shown in FIG. 21, through holes 185*b* and 186*b* are formed by sand blasting using the metal mask 161 as a mask. Here again, the wiring patterns 130 and 140 directly below the through-holes 185*a* and 186*a* serve as a stopper. Then, the through-holes having different depths can be formed. Furthermore, the through-holes 185*a* and 186*a* have different diameters according to the depths of the through-holes 183*b* and 184*b*, assuring sufficient diameters at the bottoms of the through-holes.

Figure 22:
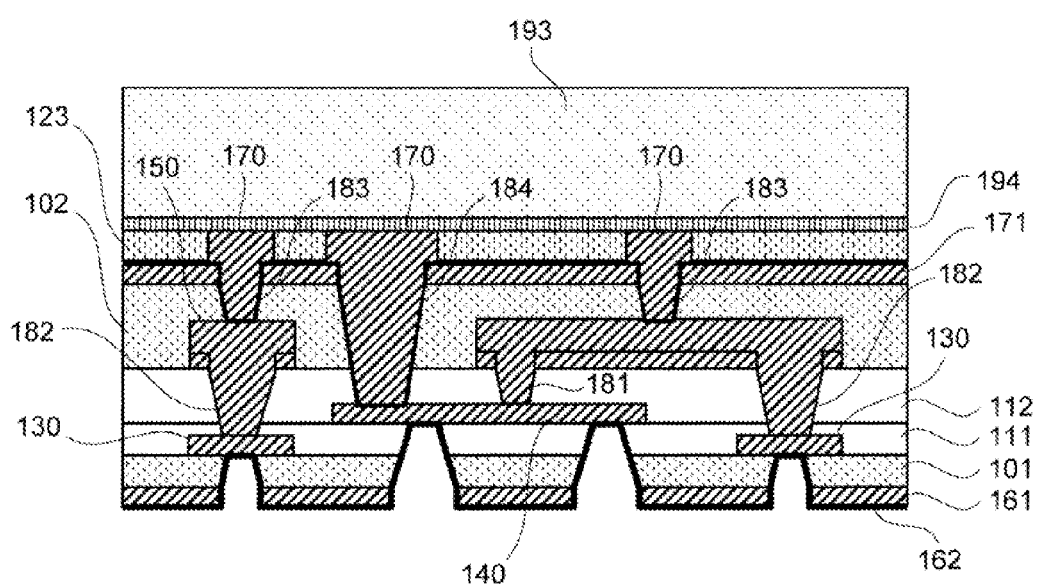
FIG. 22 is process diagram showing a process of forming a base conductor layer that is a part of the manufacturing process of the multilayer circuit board shown in FIG. 1.

Then, as shown in FIG. 22, a thin base conductor layer 162 is formed on the entire surface of the core layer 101 including the insides of the through-holes 185*b* and 186*b* by a vapor growth method. Consequently, the portions of the wiring pattern 130 that are exposed at the bottoms of the through-holes 185*b* and the portions of the wiring pattern 140 that are exposed at the bottoms of the through-holes 186*b* are directly covered with the base conductor layer 162.

Figure 23:
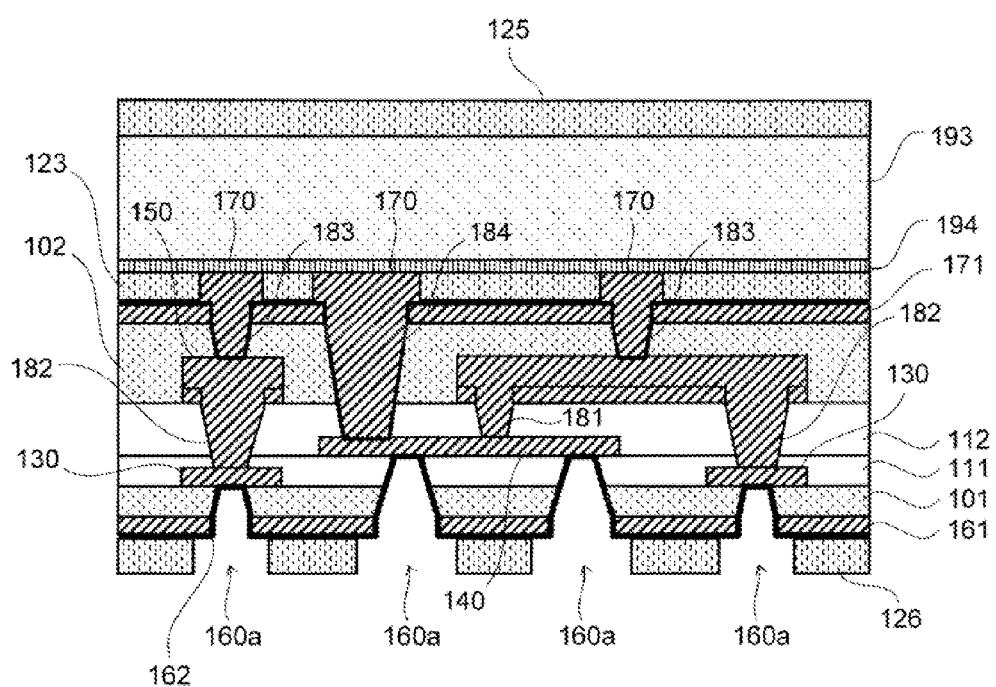
FIG. 23 is process diagram showing a process of affixing and exposing dry films that is a part of the manufacturing process of the multilayer circuit board shown in FIG. 1.
Figure 24:
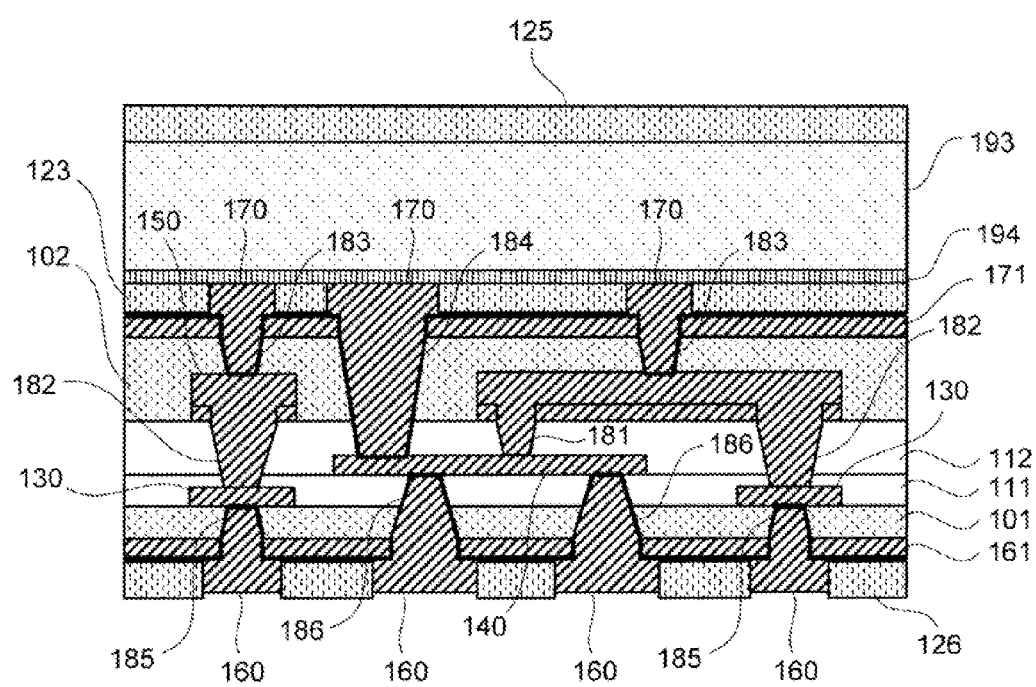
FIG. 24 is process diagram showing a process of forming a wiring pattern that is a part of the manufacturing process of the multilayer circuit board shown in FIG. 1.

Then, as shown in FIG. 23, photosensitive dry films 125 and 126 are applied to either side of the board, in other words, to the surface of the support substrate 193 and the surface of the base conductor layer 162. Subsequently, the dry film 126 is exposed using a not-shown photo-mask to remove it in areas 160*a* where a wiring pattern 160 is to be formed. Now, the base conductor layer 162 is exposed in the areas 160*a* where the wiring pattern 160 is to be formed. Here, the dry film 125 is not removed and the entire surface of the support substrate 193 is kept substantially covered.

After partially exposed as described above, as shown in FIG. 24, the base conductor layer 162 is subject to electrolytic plating to form the wiring pattern 160 in the areas 160*a* where the base conductor layer 162 is exposed. In addition, the through-holes 185*b* and 186*b* are filled with through electrodes 185 and 186. Consequently, the through electrode 185 penetrates the core layer 101, whereby the wiring patterns 130 and 160 are connected via the through electrode 185. Similarly, the through electrode 186 penetrates the core layer 101 and resin layer 111, whereby the wiring patterns 140 and 160 are connected via the through electrode 186. The entire surface of the support substrate 193 is substantially covered with the dry film 125 so that it is not plated.

Figure 25:
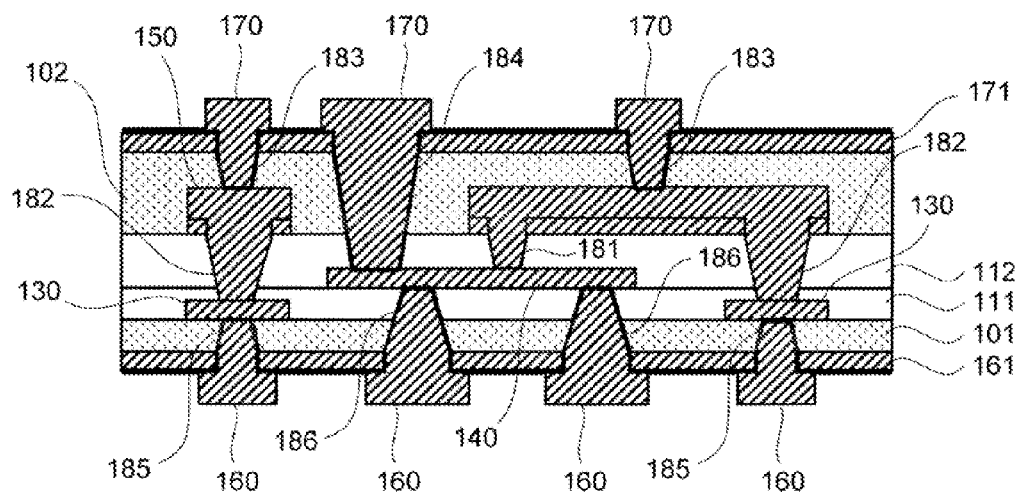
FIG. 25 is process diagram showing a process of peeling off a support substrate that is a part of the manufacturing process of the multilayer circuit board shown in FIG. 1.

Then, as shown in FIG. 25, the heat release sheet 194 is heated to the release temperature T2 or higher to release the support substrate 193 attached later together with the dry film 125 and also remove unnecessary dry films 123 and 126. Then, unnecessary portions of the base conductor layers 162 and 172 and metal masks 161 and 171 where the wiring patterns 160 and 170 are not formed are removed (soft etched) using an etching solution such as an acid to complete the multilayer circuit board 100 shown in FIG. 1.

As described above, in this embodiment, the production processes proceed with the core layer 101 being immobilized on the support substrate 191 and the core layer 102 being immobilized on the support substrate 193. Therefore, the distortion of the core layers 101 and 102 is minimized in the course of production even though they have a smaller thickness than conventional ones. This allows wiring patterns having smaller pitches to be embedded.

The support substrates 191 and 193 also offer improved handling ability during the processing, thereby preventing breaking, cracking, and deformation.

Furthermore, in the present embodiment, the through-holes are formed by blasting using a metal mask. In this way, a large number of though-holes can be formed in a short time. The wiring patterns serving as a stopper, fluctuations in abrasion rate due to differences in level of the through-holes can be absorbed, whereby more extended abrasion conditions can be applied.

In the above embodiment, the through electrodes 185 and 186 are formed after the support substrate 191 is released (see FIGS. 19 to 24). However, the through electrodes 185 and 186 can be formed before the support substrate 101 is released.

FIGS. 26 to 31 are process diagrams used to describe the method for manufacturing the multilayer circuit board 100 in which the through electrodes 185 and 186 are formed before the support substrate 101 is released.

Figure 26:
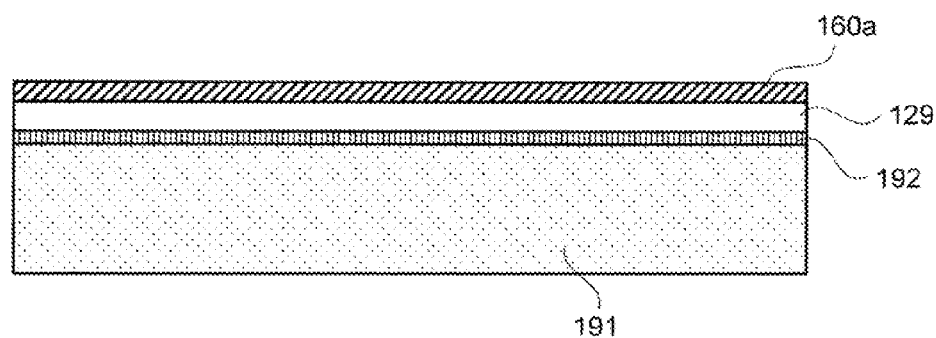
FIG. 26 is process diagram showing a process of affixing a support substrate that is a part of a modified manufacturing process of the multilayer circuit board shown in FIG. 1.

First, as shown in FIG. 26, a film 129 having a conductive layer 160*a* on one surface is prepared and attached to a support substrate 191 via a heat release sheet 192. The material of the film 129 can be, for example, PET (polyethylene terephthalate).

Figure 27:
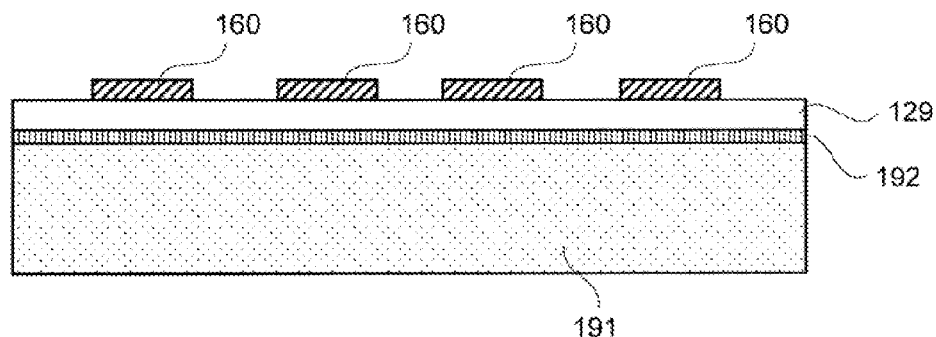
FIG. 27 is process diagram showing a process of forming a wiring pattern that is a part of the modified manufacturing process of the multilayer circuit board shown in FIG. 1.

Then, as shown in FIG. 27, the conductive layer 160*a* is patterned to form a wiring pattern 160. As described above, the wiring pattern 160 is a wiring pattern formed on the surface of the core board 101. The wiring pattern 160 is formed before the core board 101 is formed in this embodiment.

Figure 28:
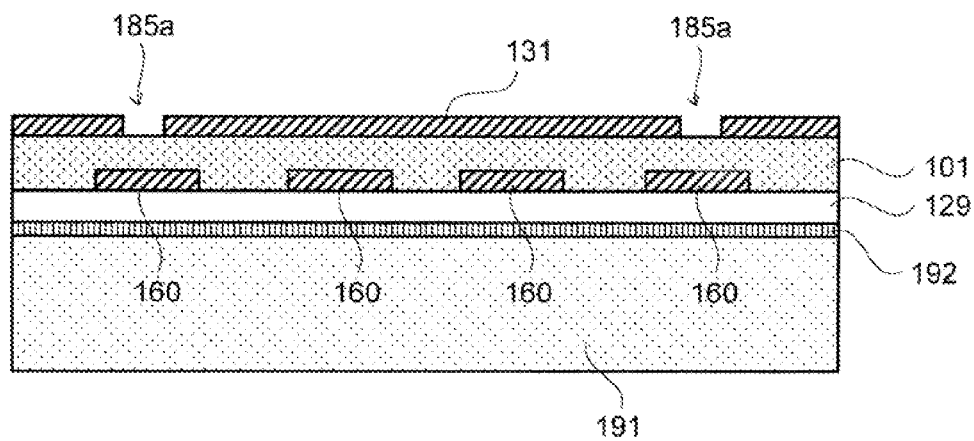
FIG. 28 is process diagram showing a process of forming a core layer and a metal mask that is a part of the modified manufacturing process of the multilayer circuit board shown in FIG. 1.

Then, as shown in FIG. 28, a core board 101 covering the film 129 and wiring pattern 160 is formed and a metal mask 131 is formed on the surface of the core board 101. This process can be done using the same technique as described with reference to FIGS. 11 to 13. Subsequently, the metal mask 131 is patterned to form multiple through-holes 185*a*. These through-holes 185*a* are provided at positions where through electrodes 185 are to be formed.

Figure 29:
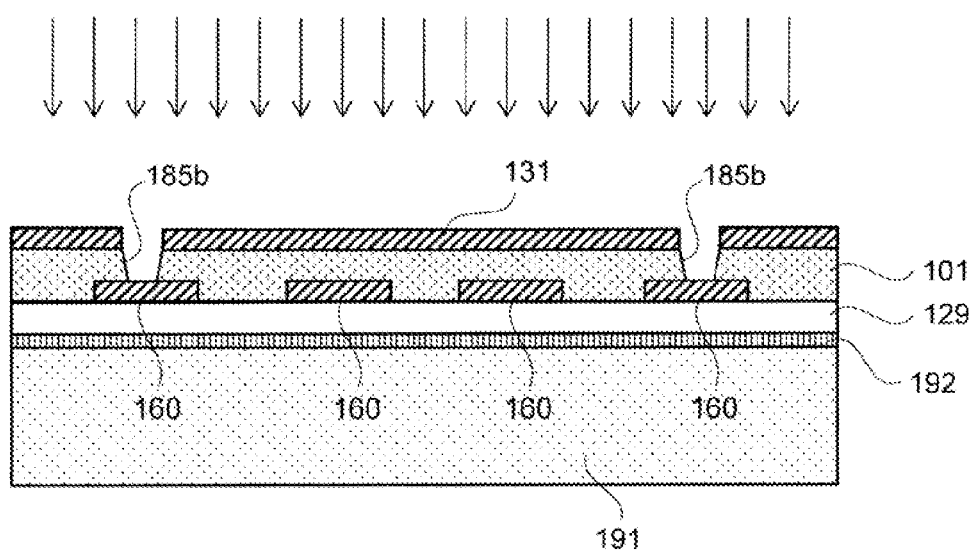
FIG. 29 is process diagram showing a process of forming a through-hole that is a part of the modified manufacturing process of the multilayer circuit board shown in FIG. 1.

Then, as shown in FIG. 29, through-holes 185*b* are formed by sand blasting using the metal mask 131 as a mask. Here, the wiring pattern 160 directly below the through-holes 185*a* serves as a stopper.

Figure 30:
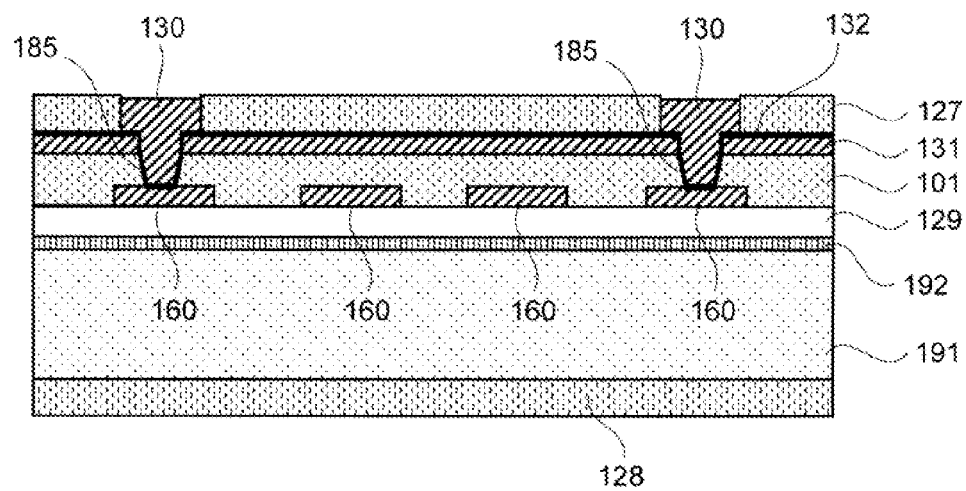
FIG. 30 is process diagram showing a process of forming a base conductor layer to forming a wiring pattern that is a part of the modified manufacturing process of the multilayer circuit board shown in FIG. 1.

Then, as shown in FIG. 30, a thin base conductor layer 132 is formed on the entire surface of the core board 101 including the insides of the through-holes 185*b* by a vapor growth method such as sputtering. Subsequently, photosensitive dry films 127 and 128 are applied to either side of the board. The dry film 127 is exposed using a not-shown photo-mask to remove it in areas where a wiring pattern 130 is to be formed. Now, the partially exposed base conductor layer 132 is subject to electrolytic plating to form the wiring pattern 130. In addition, the through-holes 185*b* are filled with through electrodes 185. Consequently, the through electrode 185 penetrates the core board 101, whereby the wiring patterns 130 and 160 are connected via the through electrode 185

Figure 31:
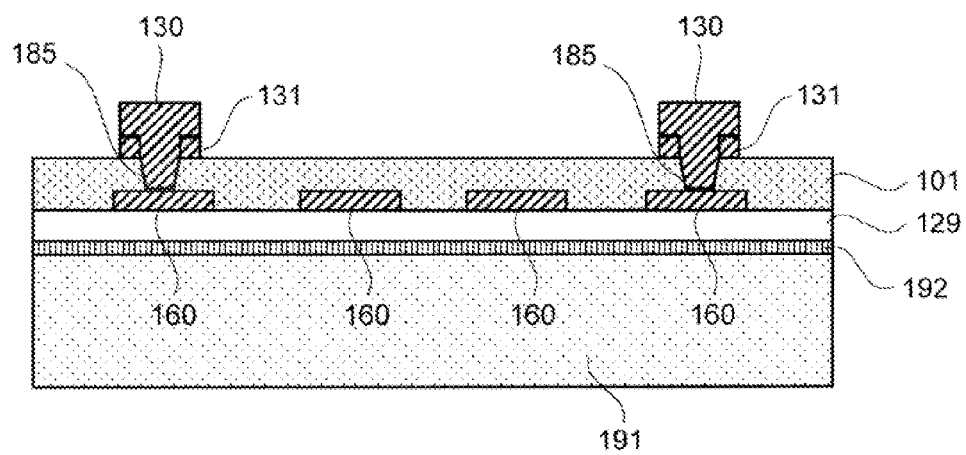
FIG. 31 is process diagram showing a process of removing a base conductor layer and a metal mask that is a part of the modified manufacturing process of the multilayer circuit board shown in FIG. 1.

Then, as shown in FIG. 31, the dry films 127 and 128 are released. Furthermore, unnecessary portions of the base conductor layer 132 and metal mask 131 where the wiring pattern 130 is not formed are removed (soft-etched) using an etching solution such as an acid. Consequently, the wring patterns 130 and 160 are formed on either side of the core board 101 and connected to each other via the through electrode 185.

Then, the processes of FIGS. 28 to 31 are repeated to form the resin layer 111, wiring pattern 140, and through electrode 186. Then, the processes shown in FIG. 5 and after are repeated to complete nearly the same board as the multilayer circuit board 100 shown in FIG. 1. The film 129 can be released while the support substrate 191 is released. In this way, the through electrodes 185 and 186 can be formed before the resin layers 111 and 112 are formed in the present invention.

Figure 32:
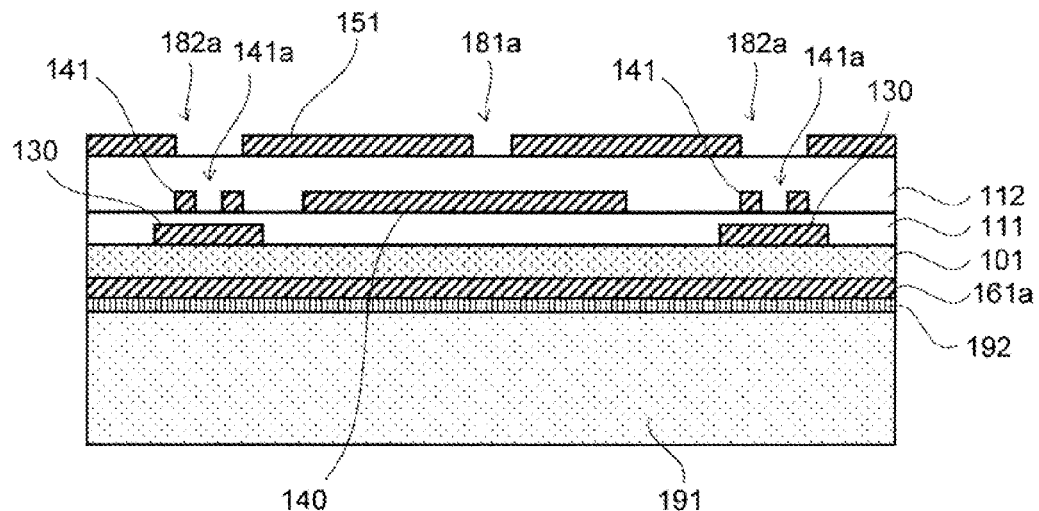
FIG. 32 is process diagram showing a process of forming a metal mask that is a part of another modified manufacturing process of the multilayer circuit board shown in FIG. 1.
Figure 33:
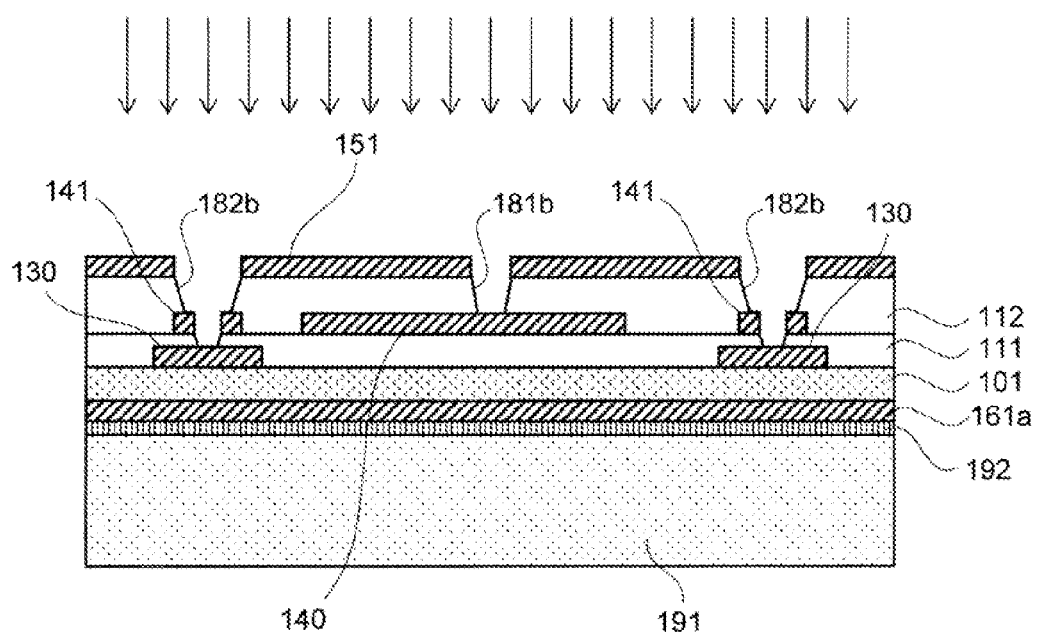
FIG. 33 is process diagram showing a process of forming a through-hole that is a part of another modified manufacturing process of the multilayer circuit board shown in FIG. 1.

Then, as shown in FIG. 32, for example, an intermediate layer 141 having an through-hole 141*a* at the positions corresponding to the deep through-hole 182*b* can be formed for forming the through-holes 181*b* and 182*b*. In such a case, the through-hole 141a should have a diameter smaller than the through-hole 182a formed in the metal mask 151. The through-hole 141a of this intermediate layer 14 assures more accurate control over the position and diameter at the bottom of the through-hole 182b during the blasting to form the through-hole 182b. In this way, the though-holes can properly be formed at correct positions even if fine wiring patterns have to be exposed at the bottoms of deep through-holes.

The technique for forming through-holes is not restricted to blasting as in the above embodiment and through-holes can be formed by laser irradiation.

A second preferable embodiment of the present invention is described hereafter.

Figure 34:
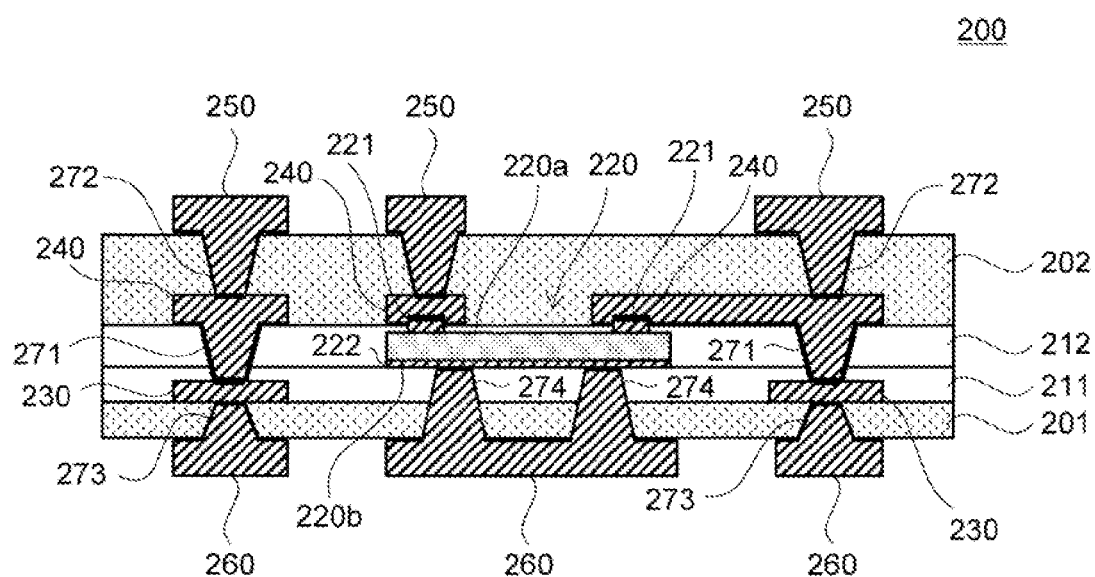
FIG. 34 is a schematic sectional view showing the structure of a multilayer circuit board according to a second preferred embodiment of the present invention.

FIG. 34 is a schematic cross-sectional view showing the structure of a multilayer circuit board (semiconductor IC-embedded circuit board) 200 according to the second preferable embodiment of the present invention.

As shown in FIG. 34, the multilayer circuit board 200 of this embodiment comprises outermost core layers 201 and 202, resin layers 211 and 212 interposed between the core layers 201 and 202, a semiconductor IC 220 embedded between the resin layers 211 and 212, alignment marks 230, various wiring patterns 240, 250, and 260, and through electrodes 271 to 274. On the pad electrodes (not shown in FIG. 34) of the semiconductor IC 220 provided are stud bumps 221 that are a type of conductive protrusions so that the pad electrodes are each electrically connected to the wiring pattern 240 via the corresponding stud bumps 221. The stud bumps 221 protrude from the resin layer 212 as shown FIG. 34.

However, the conductive protrusions provided to the semiconductor IC 220 are not restricted to stud bumps and various bumps such as plate bumps, plated bumps, and ball bumps can be used in the present invention. When the conductive protrusions are stud bumps, they can be made of gold, silver, or copper formed by wire-bonding. When they are plate bumps, they can be formed by plating, sputtering, or vapor depositing. When they are plated bumps, they can be formed by plating. When they are ball bumps, they can be formed by placing and fusing solder balls on the land electrodes or printing and fusing cream solder on the land electrodes. Metals usable for the conductive protrusions are not particularly restricted and, for example, gold (Au), silver (Ag), copper (Cu), nickel (Ni), zinc (Sn), chromium (Cr), nickel-chromium alloy (Ni—Cr), and solder can be used. Bumps formed by screen printing a conductive material and hardening it into a conical or cylindrical bump or by printing and sintering nanopaste under heat can be used.

The conductive protrusions such as the stud bumps 221 preferably have a height of 5 to 200 μm and more preferably a height of 10 to 80 μm. When the height is less than 5 μm, the resin layer 212 covering the main surface 220a of the semiconductor IC 220 is completely removed in the process of exposing the heads of the stud bumps, which is described later. This may damage the main surface 220a of the semiconductor IC 220. On the other hand, when the height exceeds 200 μm, it is difficult to form the conductive protrusions and the height may largely vary.

Although this is not shown, passive components such as capacitors can be mounted on at least one of the outermost wiring patterns 250 and 260.

In the multilayer circuit board 200 of this embodiment, the embedded semiconductor IC 220 is thinned by abrasion, whereby the total thickness of the multilayer circuit board 200 can be reduced to 1 mm or smaller, for example, up to approximately 200 μm. Furthermore, as described later, the semiconductor IC 220 is positioned in relation to the alignment marks 230 in this embodiment. Therefore, there is a very little chance that the relative positions between the horizontal positions of the stud bumps 121 and the various wiring patterns 240, 250, and 260 are shifted.

Figure 35:
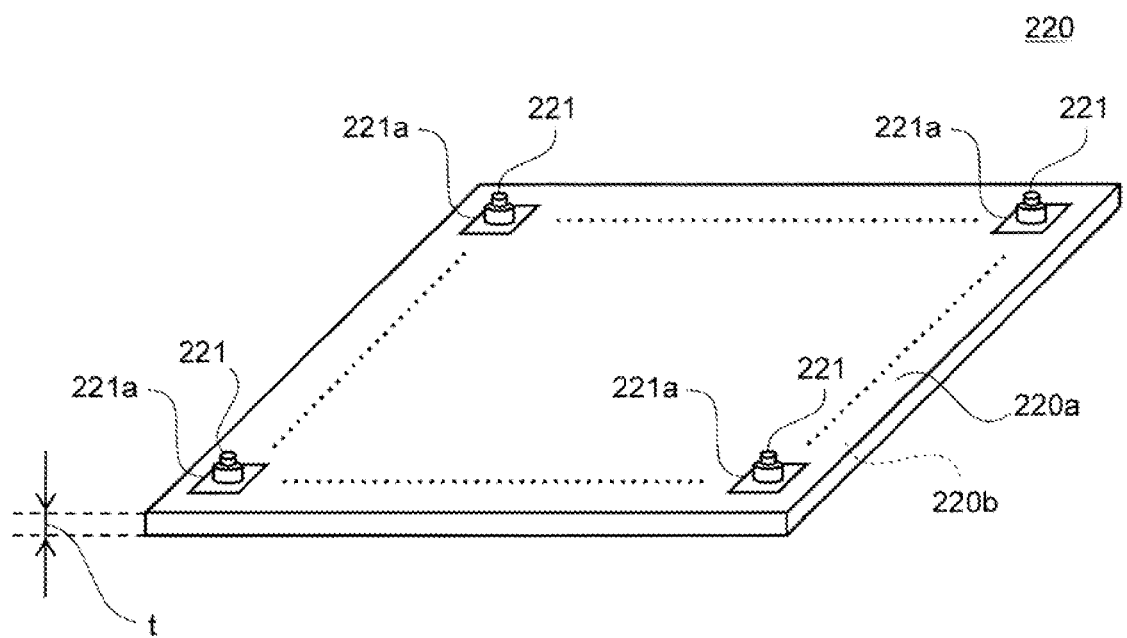
FIG. 35 is a schematic perspective view showing the structure of a semiconductor IC.

FIG. 35 is a perspective view showing the structure of the semiconductor IC 220.

As shown in FIG. 35, the semiconductor IC 220 is a bare semiconductor IC chip and has many pad electrodes 221a on the main surface 220a. As described later, in the multilayer circuit board 200 of this embodiment, the heads of the stud bumps 221 are exposed at a time by wet blasting. Therefore, problems that occur with laser irradiation in exposing pad electrodes are not observed.

In other words, when the individual stud bumps 221 are exposed by laser irradiation after the semiconductor IC 220 is embedded, higher processing accuracy is required as the electrode pitch of the semiconductor IC 220 is reduced and a prolonged processing time is necessary in proportion to the number of the stud bumps 221. Furthermore, as the electrode pitch of the semiconductor IC 220 is reduced, vias having smaller diameters have to be formed by the laser irradiation and desmearing inside the via becomes difficult. These problems can be eliminated by exposing the heads of the stud bumps 221 at a time using wet blasting as in this embodiment. Therefore, the pad electrodes 221a having pitches (electrode pitches) as small as, but not restricted to, 100 μm or smaller, for example 60 μm can be used.

The semiconductor IC 220 is abraded on the rear surface 202b and has a thickness t (the distance between the main surface 220a and the rear surface 220b) much smaller than conventional semiconductor ICs. The thickness t of the semiconductor IC 220 is not particularly restricted; however, it is preferably 200 μm or smaller, for example approximately 30 to 100 μm. Preferably, the abrasion of the rear surface 220b is performed on a number of semiconductor ICs in the form of a wafer at a time and, then, individual semiconductor ICs 220 are separated by dicing. When individual semiconductor ICs 220 are separated by dicing before they are abraded to a small thickness, the rear surface 220b can effectively be abraded with the main surface 220a of the semiconductor IC 220 being covered with a thermoplastic resin.

However, the technique for thinning the semiconductor IC 220 is not restricted to abrasion in the present invention. Other techniques such as etching, plasma processing, laser irradiation, and blasting can be used to reduce the thickness.

The stud bumps 221 formed on the respective pad electrodes 221a is appropriately sized according to the electrode pitch. For example, when the electrode pitch is approximately 100 μm, their diameter can be approximately 30 to 80 μm and their height can be approximately 10 to 80 μm. The stud bumps 221 can be formed on the respective pad electrodes 221a by wire-bonding after individual semiconductor ICs 220 are separated by dicing. The material of the stud bumps 221 is not particularly restricted although copper (Cu) is preferably used. The stud bumps 221 made of copper (Cu) exhibit high bonding strength to the pad electrode 221a compared to gold (Au), improving reliability.

As shown in FIG. 34, in the multilayer circuit board 200 of this embodiment, the main surface 220a of the semiconductor IC 220 is directly covered with the resin layer 212 and the rear surface 220b of the semiconductor IC 220 is directly covered with the resin layer 211. The stud bumps 221 of the semiconductor IC 220 protrude from the resin layer 212 and are connected to the wiring pattern 140 with these protruded portions.

A metal layer 222 is formed on the rear surface 220b of the semiconductor IC 220. The metal layer 222 serves as a heat releasing passage for heat generated by the action of the semiconductor IC 220 and as effective protection against cracks occurring in the rear surface 220b of the semiconductor IC 220. Furthermore, the metal layer 222 serves for improved handling ability.

The metal layer 222 is connected to the wiring pattern 260 formed in the outermost layer via through electrodes 274 formed through the rein layer 211 and core layer 201. The through electrodes 274 serve as a heat releasing passage for heat generated by the semiconductor IC 220, whereby the heat is significantly effectively released to the mother board. Therefore, the semiconductor IC 220 can be, but not restricted to, significantly high operation frequency digital ICs such as CPUs and DSPs.

The material of the resin layers 211 and 212 can be a thermosetting or thermoplastic resin as long as it has a reflow durability. Specifically, the usable materials of the resin layers 111 and 112 in the first embodiment can be used. As for the material of the core layers 201 and 202, the usable materials of the core layers 101 and 102 in the first embodiment can be used. The core layers 201 and 202 have a thickness of 100 μm or smaller and preferably a thickness of 60 μm or smaller, which is much smaller than the conventional core layers.

The method for manufacturing the multilayer circuit board 200 shown in FIG. 34 is described hereafter with reference to the drawings.

FIGS. 36 to 57 are process diagrams used to describe the method for manufacturing the multilayer circuit board 200 shown in FIG. 34.

Figure 36:
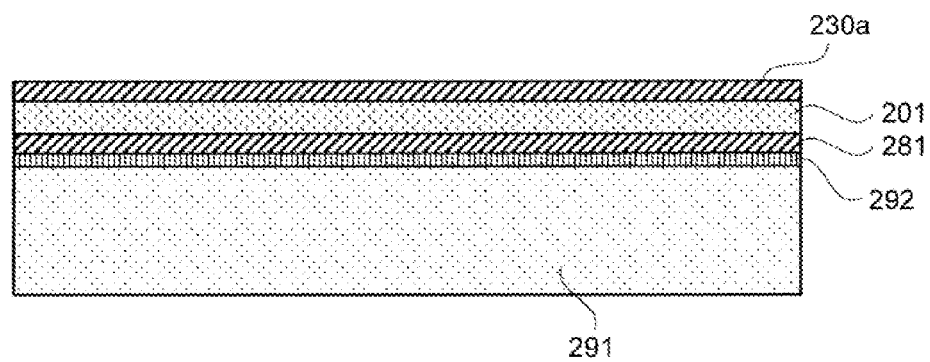
FIG. 36 is process diagram showing a process of affixing a support substrate that is a part of the manufacturing process of the multilayer circuit board shown in FIG. 34.

First, as shown in FIG. 36, a core layer 201 having conductive layers 230a and 281 on either side is prepared and attached to a support substrate 291. In this embodiment, a heat release sheet 292 is used to attach the support substrate 291. The adhesion of the heat release sheet 292 is reduced under heat and, therefore, the support substrate 291 is easily released. The material of the support substrate 291 is not particularly restricted. For example, nickel (Ni) and stainless can be used. The thickness of the support substrate 291 is not particularly restricted as long as a required mechanical strength is assured. For example, the thickness can be approximately 50 to 2000 μm. On the other hand, the thickness of the core layer 201 is 100 μm or smaller and preferably 60 μm or smaller as described above.

Figure 37:
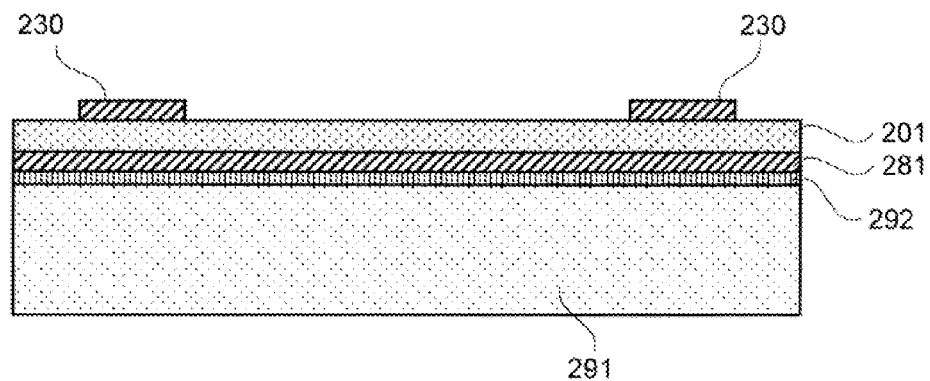
FIG. 37 is process diagram showing a process of forming alignment marks that is a part of the manufacturing process of the multilayer circuit board shown in FIG. 34.

Then, as shown in FIG. 37, the conductive layer 230a is patterned to form alignment marks 230. The alignment marks 230 of this embodiment are also used as an actual wiring pattern. An etching solution such as ferric chloride can be used to pattern the conductive layer 230a. Here, the core layer 201 is subject to deformation because of differences in physical properties from the copper foil, release of stress generated during the pre-preg preparation, vertical and horizontal anisotropies of the core material, and a small amount of water absorption during the patterning. However, in this embodiment, the core layer 201 is attached to the support substrate 291, whereby the deformation is minimized.

Figure 38:
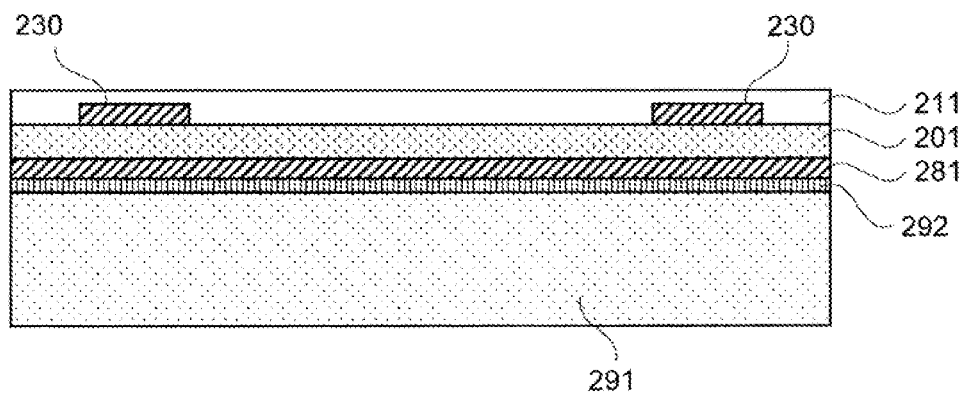
FIG. 38 is process diagram showing a process of forming a resin layer that is a part of the manufacturing process of the multilayer circuit board shown in FIG. 34.

Then, as shown in FIG. 38, a resin layer 212 is formed to cover the core layer 201 and alignment marks 230.

Figure 39:
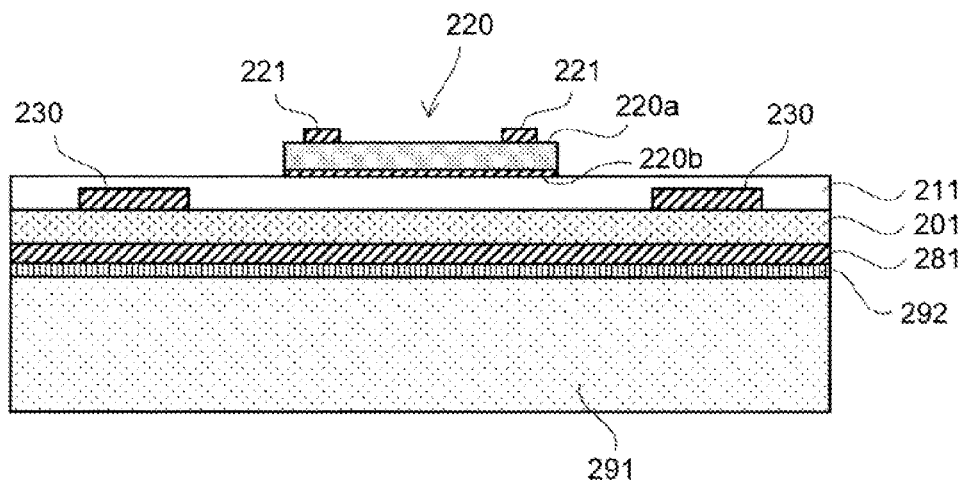
FIG. 39 is process diagram showing a process of mounting a semiconductor IC that is a part of the manufacturing process of the multilayer circuit board shown in FIG. 34.

Then, as shown in FIG. 39, a semiconductor IC 220 is mounted on the surface of the resin layer 212 using the alignment marks 230 for positioning. In this embodiment, the semiconductor IC 220 is mounted in the face-up manner, in other words, with the main surface 220a facing upward. In this way, the rear surface 220b of the semiconductor IC 220 is completely covered with the resin layer 212. Here, when the resin layer 211 is made of a thermosetting resin, the semiconductor IC 220 can be fixed to the resin layer 211 by heating.

Alternatively, when the resin layer 211 is made of a thermoplastic resin, the adhesion can be improved by hearing and fusing.

Figure 40:
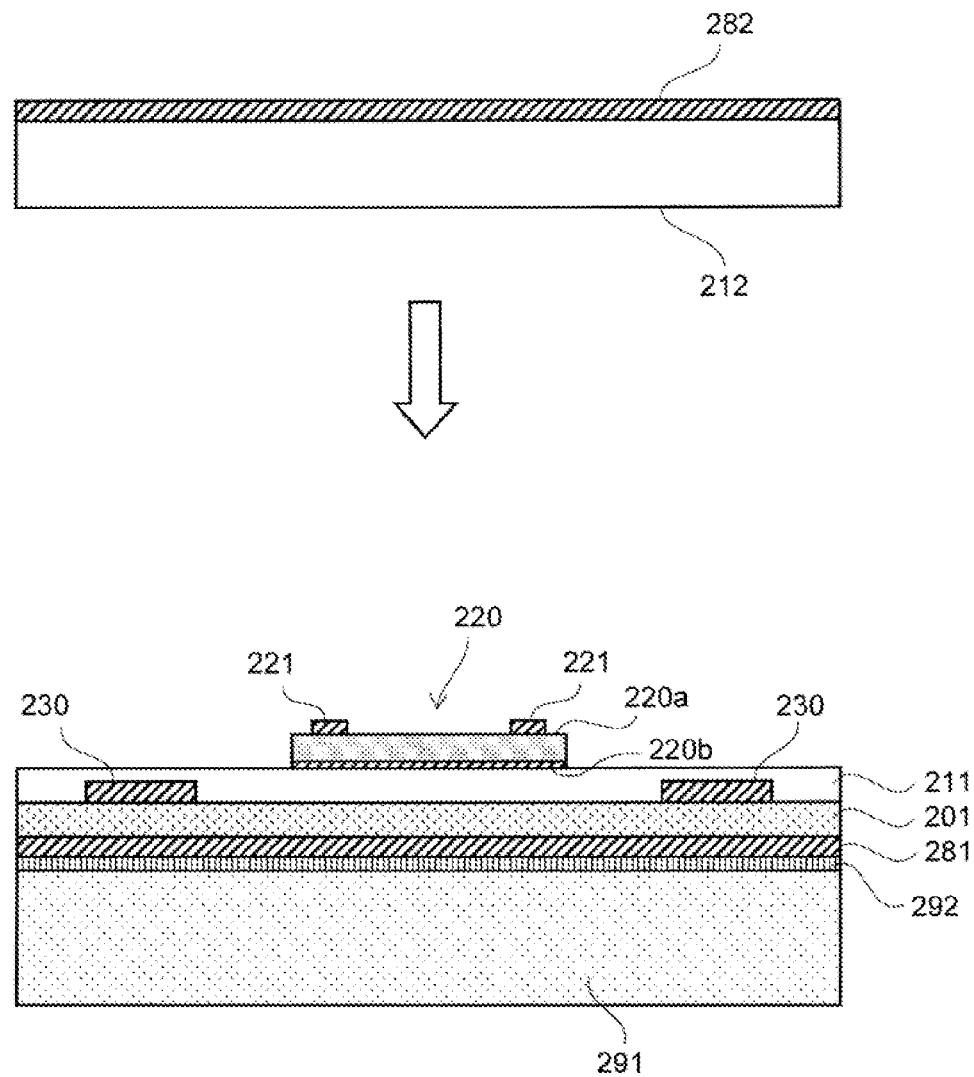
FIG. 40 is process diagram showing a process of pressing a resin layer (before pressing) that is a part of the manufacturing process of the multilayer circuit board shown in FIG. 34.
Figure 41:
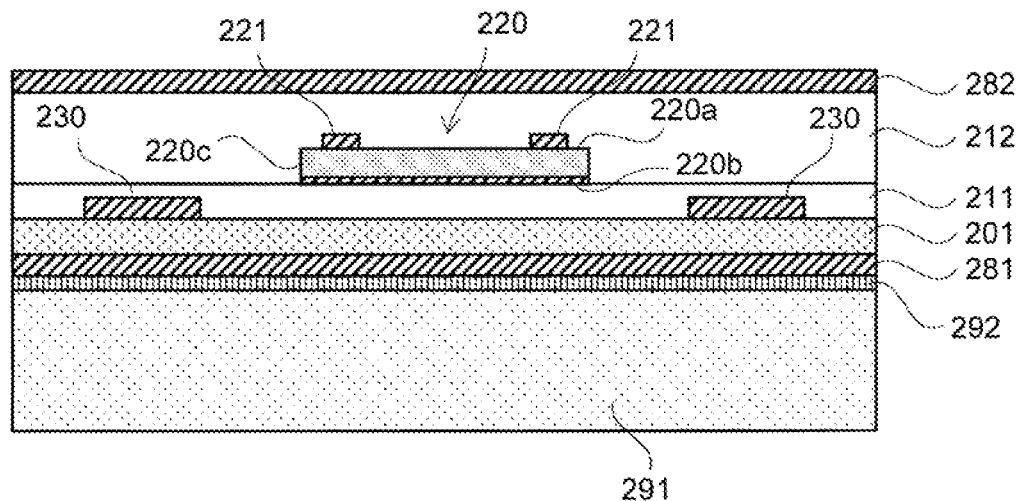
FIG. 41 is process diagram showing a process of pressing the resin layer (after pressing) that is a part of the manufacturing process of the multilayer circuit board shown in FIG. 34.

Then, as shown in FIG. 40, a laminated sheet of an uncured or partially cured resin layer 212 and a conductive layer 282 is pressed under heat with the resin layer 212 and the main surface 220a of the semiconductor IC 220 facing each other. Then, the resin layer 212 is cured. Consequently, as shown in FIG. 41, the main surface 220a and sidewalls 220c of the semiconductor IC 220 are completely covered with the resin layer 212. In this point, the semiconductor IC 220 is enclosed by the resin layers 211 and 212.

During the above pressing, the core layer 201 receives high pressure and the resin flows horizontally or the resin flows to smooth the rough surface generated during the patterning and fill the semiconductor IC 220. All these cause the deformation. However, the deformation is minimized as a result of the immobilization on the support substrate 291.

Figure 42:
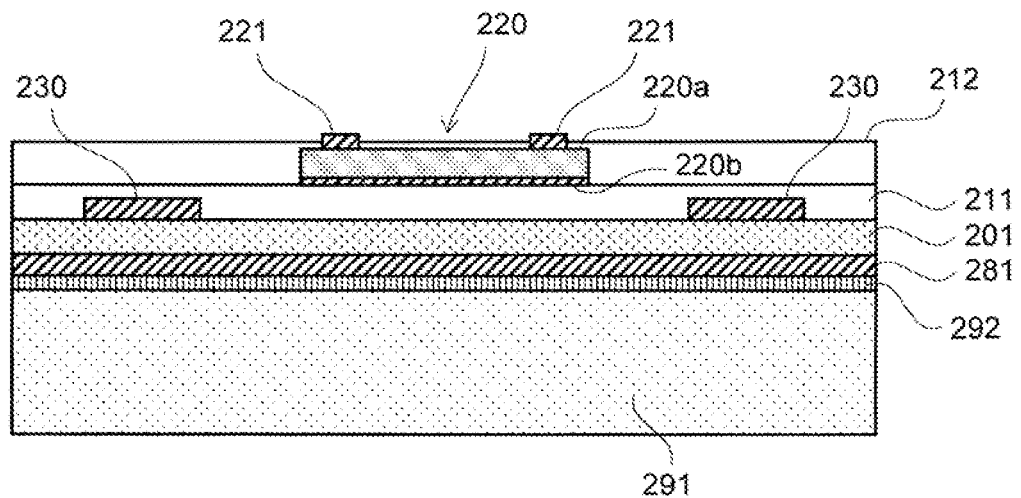
FIG. 42 is process diagram showing a process of etching the resin layer that is a part of the manufacturing process of the multilayer circuit board shown in FIG. 34.

Then, as shown in FIG. 42, after the conductive layer 282 is removed, the surface of the resin layer 212 is etched using wet blasting. In the wet blasting, materials are etched at different etching rates according to their malleability. Specifically, materials having relatively low malleability (such as cured resin) are etched at higher etching rates and materials having relatively high malleability (such as metals) are etched at lower etching rates. Therefore, by adjusting the etching rate and conditions in etching the surface of the resin layer 212 using wet blasting, the stud bumps 221 formed on the semiconductor IC 220 can be protruded from the surface of the resin layer 212. The protruding rate is preferably, but not particularly restricted to, approximately 0.1 to 20 μm.

The technique for reducing the thickness of the resin layer 212 is not restricted to wet blasting. Other techniques such as dray blasting, ion milling, and plasma etching can be used. However, the wet blasting is preferably used because of sufficient selected ratios, high processing accuracy, and high operation efficiency. On the other hand, abrasion using a buff is not preferable as the technique for reducing the thickness of the resin layer 212. The abrasion using a buff makes the stud bumps 221 flush with resin layer 212, not making them protrude. Furthermore, the conductive material constituting the stud bumps 221 is extended in the rotation direction of the buff as streaks under some abrasion conditions, which may case short-circuit. The thinned semiconductor IC 220 may crack under stress of abrasion.

The core layer 201 is subject to deformation because of stress release, water absorption, and subsequent drying after the conductive layer 282 is released or while the resin layer is etched using wet blasting. However, this deformation is minimized as a result of the immobilization on the support substrate 291.

As described above, the stud bumps 221 are exposed by reducing the thickness of the entire resin layer 212 using wet blasting, not by forming laser vias in the resin layer 212 using laser irradiation. Therefore, the heads of the stud bumps 221 can properly be exposed at a time even if the electrodes pitches are small.

Figure 43:
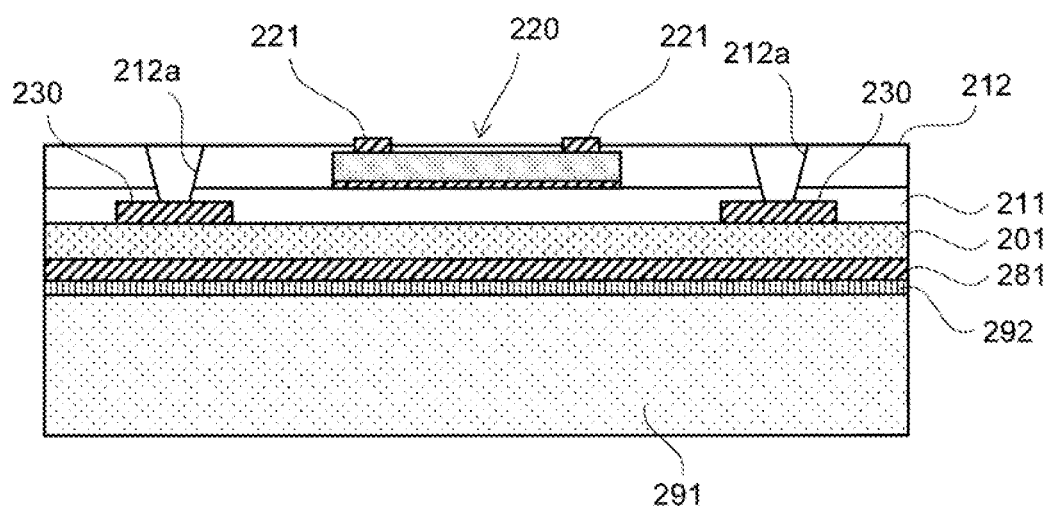
FIG. 43 is process diagram showing a process of forming through-holes that is a part of the manufacturing process of the multilayer circuit board shown in FIG. 34.

Then, as shown FIG. 43, through-holes 212a are formed through the resin layers 212 and 211 by laser irradiation from the resin layer 212 side. However, the through-holes 212a can be formed by techniques other than laser irradiation.

Figure 44:
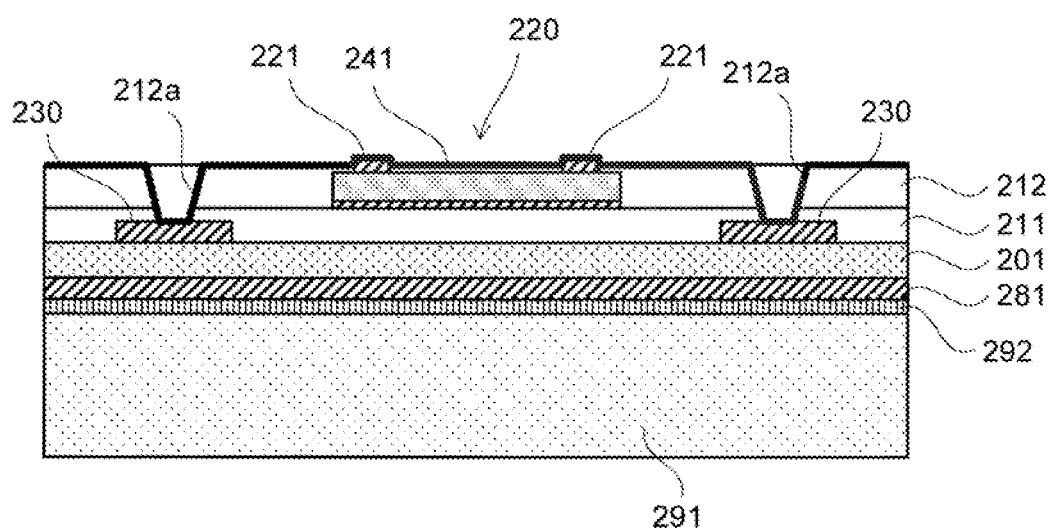
FIG. 44 is process diagram showing a process of forming a base conductor layer that is a part of the manufacturing process of the multilayer circuit board shown in FIG. 34.

Then, as shown in FIG. 44, a thin base conductor layer 241 is formed on the entire surface of the resin layer 212 including the insides of the through-holes 212a by a vapor growth method such as sputtering. Consequently, the portions of the alignment marks 230 that are exposed at the bottoms of the through-holes 212a and the protruding portions of the stud bumps 221 are directly covered with the base conductor layer 241. The base conductor layer 241 can be formed by electroless plating or vapor deposition instead of a vapor growth method. Unnecessary portions of the base conductor layer 241 are removed later; therefore, the base conductor layer 241 should have a sufficiently small thickness. The base conductor layer 241 has preferably a thickness of approximately 0.005 to 3 μm and, for example, approximately 0.3 to 2 μm.

In this embodiment, the stud bumps 221 protrude from the surface of the resin layer 212 after the wet blasting. Then, there is no need of a pre-treatment such as removal of any etching residue before the base conductor layer 241 is formed. In other words, when the stud bumps 221 are flush with the resin layer 212, the surface of the stud bumps 221 is sometimes covered with the etching residue. If the base conductor layer 241 is formed under such a condition, it may have conductive failure. Conversely, the wet blasting for the stud bumps 221 to protrude from the surface of the resin layer 212 results in completely removing the etching residue from the surfaces of the stud bumps 221. Therefore, the base conductor layer 241 can be formed with no pre-treatment.

Figure 45:
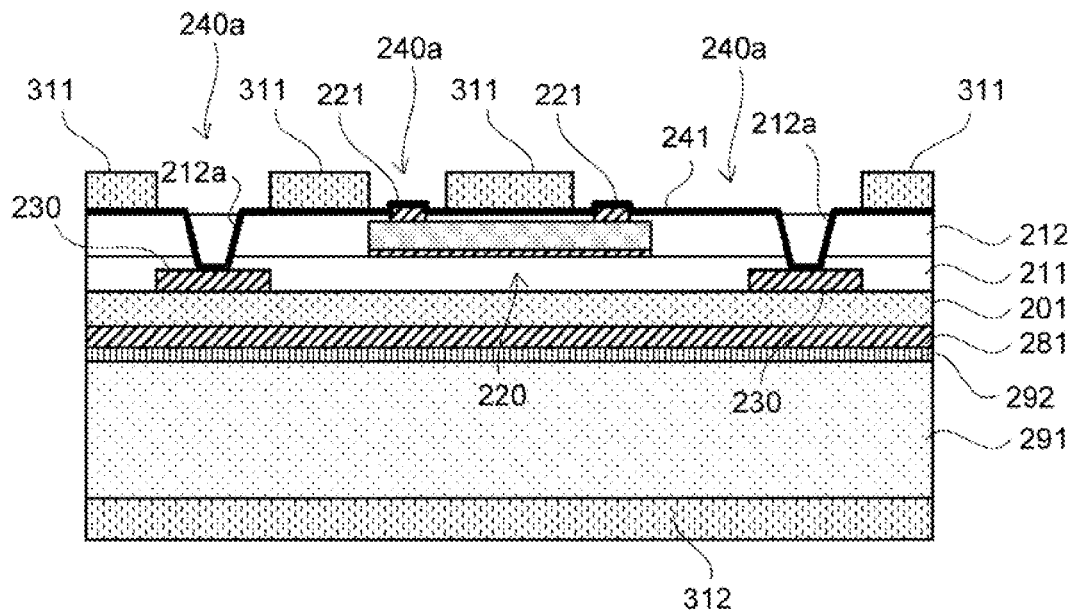
FIG. 45 is process diagram showing a process of affixing and exposing dry films that is a part of the manufacturing process of the multilayer circuit board shown in FIG. 34.

Then, as shown in FIG. 45, photosensitive dry films 311 and 312 are applied to either side of the board, in other words, to the surface of the base conductor layer 241 and the surface of the support substrate 291, respectively. The dry film 311 is exposed using a not-shown photo-mask to remove it in areas 240a where a wiring pattern 240 is to be formed. Consequently, the base conductor layer 241 is exposed in the areas 240a where the wiring pattern 240 is to be formed.

Here, the dry film 312 is not removed. The entire surface of the support substrate 291 is kept substantially covered. The dry film 311 should have a thickness slightly larger than the wiring pattern 240. For example, when the wiring pattern 240 has a thickness of approximately 20 μm, the dry film 311 has a thickness of approximately 25 μm. On the other hand, the dry film 312 is intended to prevent the surface of the support substrate 291 from being plated and can have any thickness.

The areas 240a where the wiring pattern 240 is to be formed include the areas corresponding to the stud bumps 221 as shown in FIG. 45. When the semiconductor IC 220 has small electrode pitches, significant shifts of the relative horizontal positions of the stud bumps 221 and areas 240a are not allowed. In this embodiment, the semiconductor IC 220 is positioned in relation to the alignment marks 230. Consequently, the chance that the relative horizontal positions of the stud bumps 221 and areas 240a are shifted is minimized.

Figure 46:
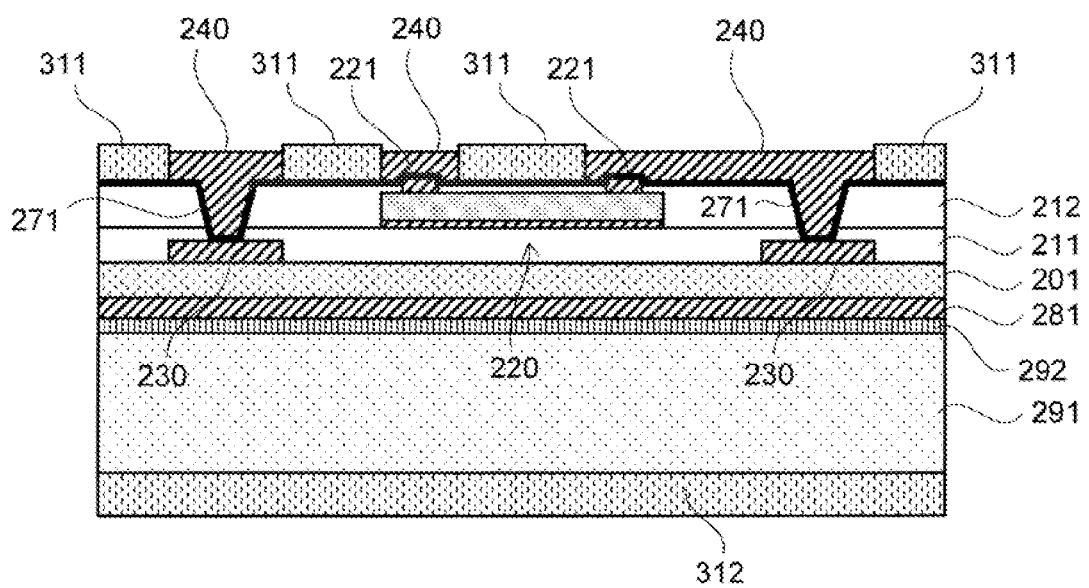
FIG. 46 is process diagram showing a process of forming a wiring pattern that is a part of the manufacturing process of the multilayer circuit board shown in FIG. 34.

After partially exposed as described above, the base conductor layer 241 is subject to electrolytic plating as shown in FIG. 46. Consequently, the wiring pattern 240 is formed in the areas 240a where the base conductor layer 241 is exposed. Furthermore, the through-holes 212a are filled with through electrodes 271. Then, the through electrode 271 penetrates the resin layers 211 and 212 and, therefore, the alignment marks 230 and wiring pattern 240 are connected via the through electrode 271. The entire surface of the support substrate 291 is substantially covered with the dry film 312 so that it is not plated.

Figure 47:
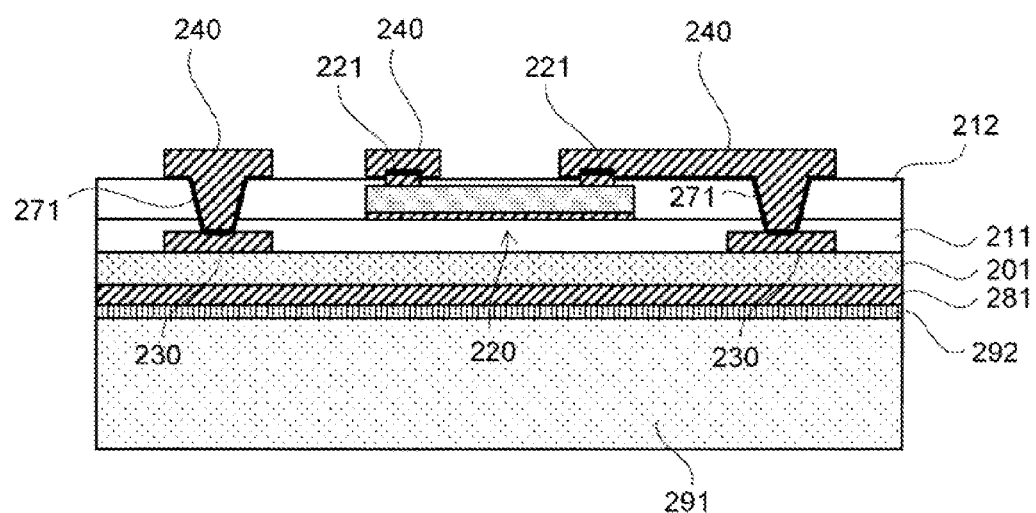
FIG. 47 is process diagram showing a process of removing the dry films and the base conductor layer that is a part of the manufacturing process of the multilayer circuit board shown in FIG. 34.

Then, as shown in FIG. 47, the dry films 311 and 312 are released and unnecessary portions of the base conductor layer 241 where the wiring pattern 240 is not formed are removed (soft-etched) using an etching solution such as an acid.

Figure 48:
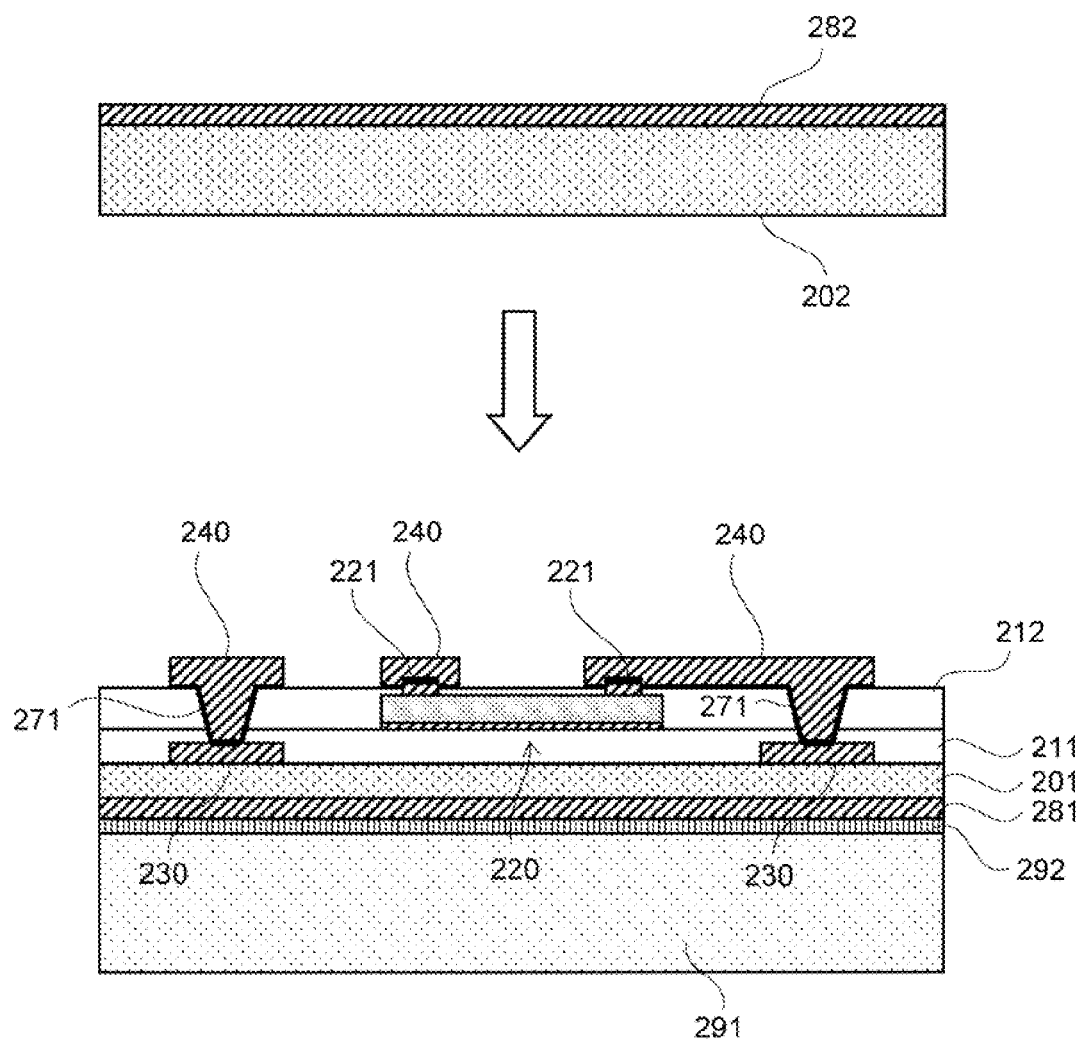
FIG. 48 is process diagram showing a process of pressing a core layer (before pressing) that is a part of the manufacturing process of the multilayer circuit board shown in FIG. 34.
Figure 49:
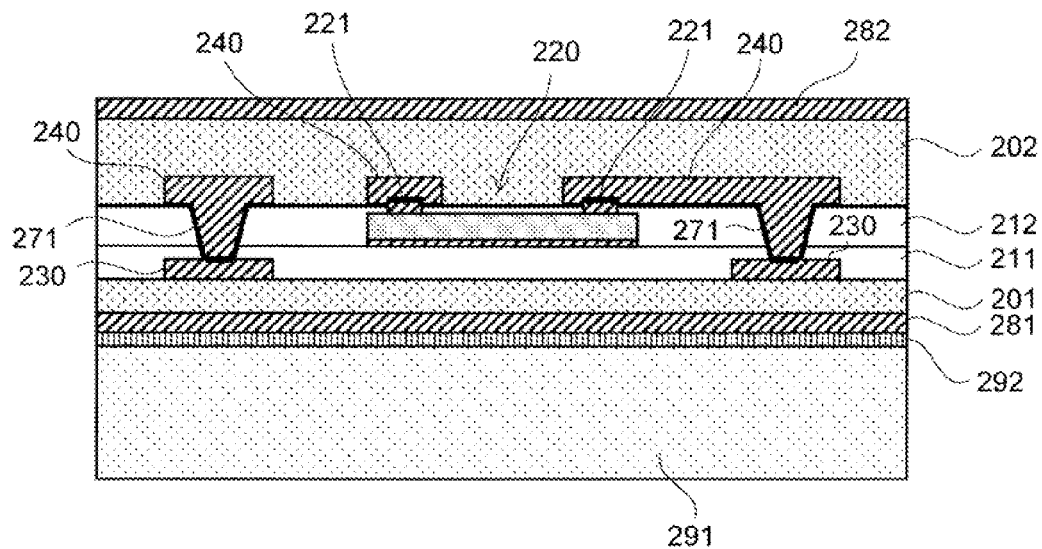
FIG. 49 is process diagram showing a process of pressing a core layer (after pressing) that is a part of the manufacturing process of the multilayer circuit board shown in FIG. 34.

Then, as shown in FIG. 48, a laminated sheet of a core layer 202 and a conductive layer 282 is pressed and heated. Consequently, as shown in FIG. 49, the wiring pattern 240 and resin layer 212 are covered with the core layer 202.

Figure 50:
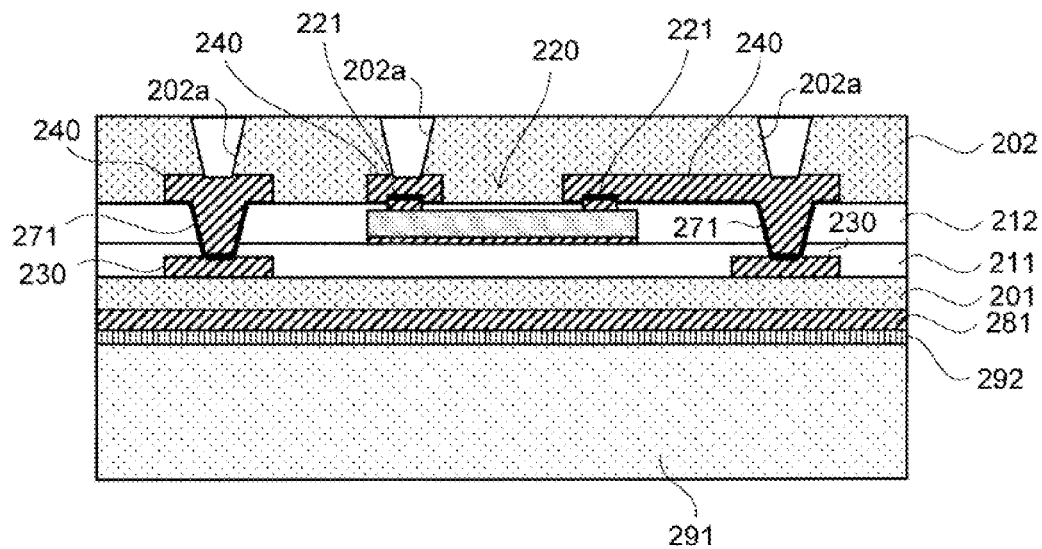
FIG. 50 is process diagram showing a process of forming through-holes that is a part of the manufacturing process of the multilayer circuit board shown in FIG. 34.

Then, as shown in FIG. 50, through-holes 202a are formed in the core layer 202 using laser irradiation after the conductive layer 282 is removed or thinned. The through-holes 202a penetrate the core layer 202 to expose the wiring pattern 240.

Figure 51:
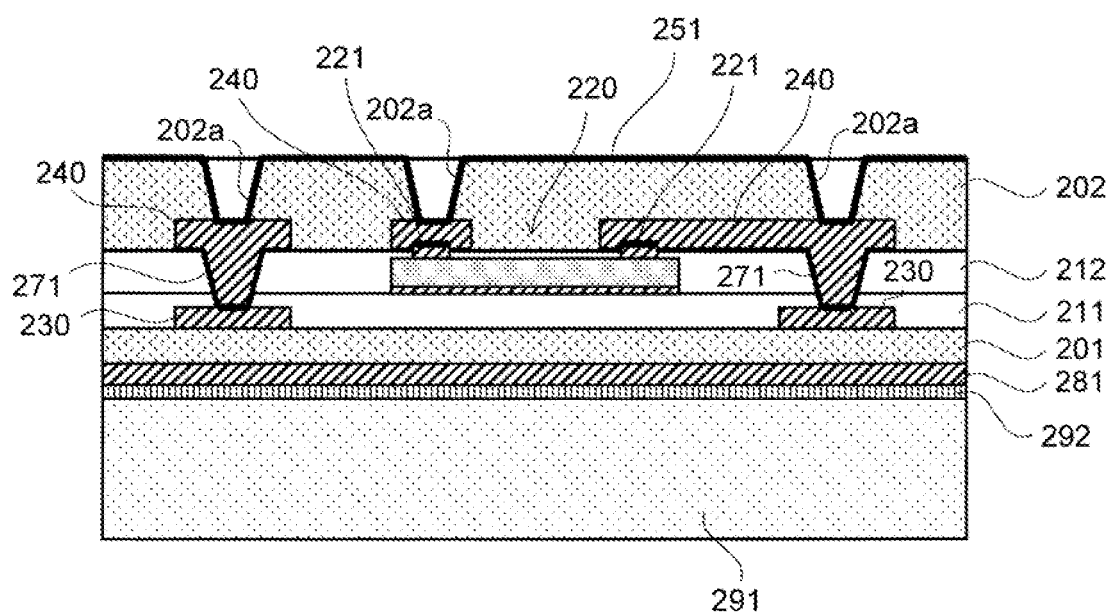
FIG. 51 is process diagram showing a process of forming a base conductor layer that is a part of the manufacturing process of the multilayer circuit board shown in FIG. 34.

Then, as shown in FIG. 51, a thin base conductor layer 251 is formed on the entire surface of the core layer 202 including the insides of the through-holes 202a using a vapor growth method. Consequently, the portions of the wiring pattern 240 that are exposed at the bottoms of the through-holes 202a are directly covered with the base conductor layer 251.

Figure 52:
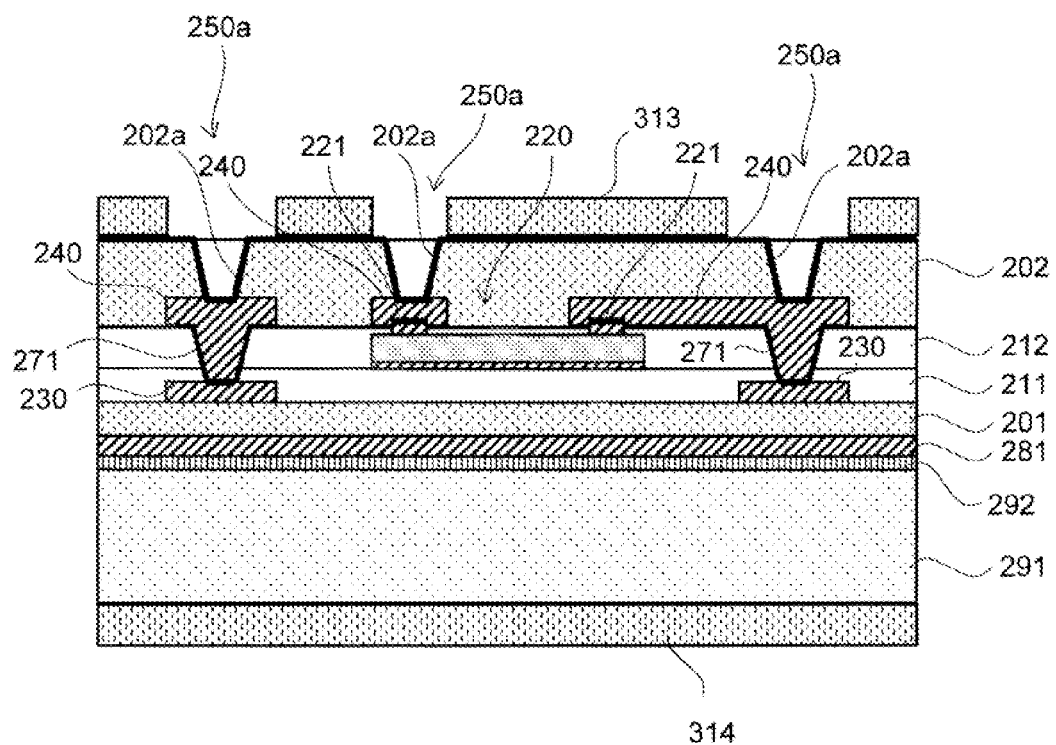
FIG. 52 is process diagram showing a process of affixing and exposing dry films that is a part of the manufacturing process of the multilayer circuit board shown in FIG. 34.

Then, as shown in FIG. 52, photosensitive dry films 313 and 314 are applied to either surface of the board, in other words, to the surface of the base conductor layer 251 and the surface of the support substrate 291. Subsequently, the dry film 313 is exposed using a not-shown photo-mask to remove it in areas where a wiring pattern 250 is to be formed. Consequently, the base conductor layer 251 is exposed in the areas 250a where the wiring pattern 250 is to be formed. Here, the dry film 314 is not removed, whereby the entire surface of the support substrate 291 is substantially kept covered.

Figure 53:
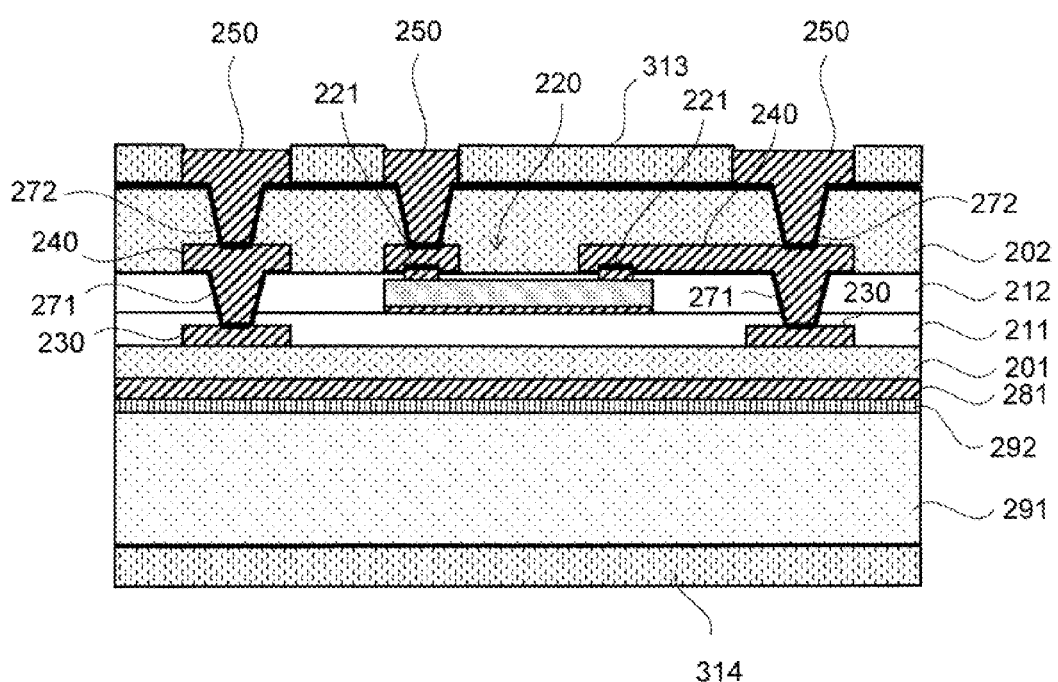
FIG. 53 is process diagram showing a process of forming a wiring pattern that is a part of the manufacturing process of the multilayer circuit board shown in FIG. 34.

After partially exposed as described above, the base conductor layer 251 is subject to electrolytic plating as shown in FIG. 53. Consequently, the wiring pattern 250 is formed in the areas 250a where the base conductor layer 251 is exposed. In addition, the through-holes 202a are filled with through electrodes 272. Consequently, the through electrode 272 penetrates the core layer 202, whereby the wiring patterns 240 and 250 are connected via the through electrode 272. The entire surface of the support substrate 291 is substantially covered with the dry film 314 so that it is not plated.

Figure 54:
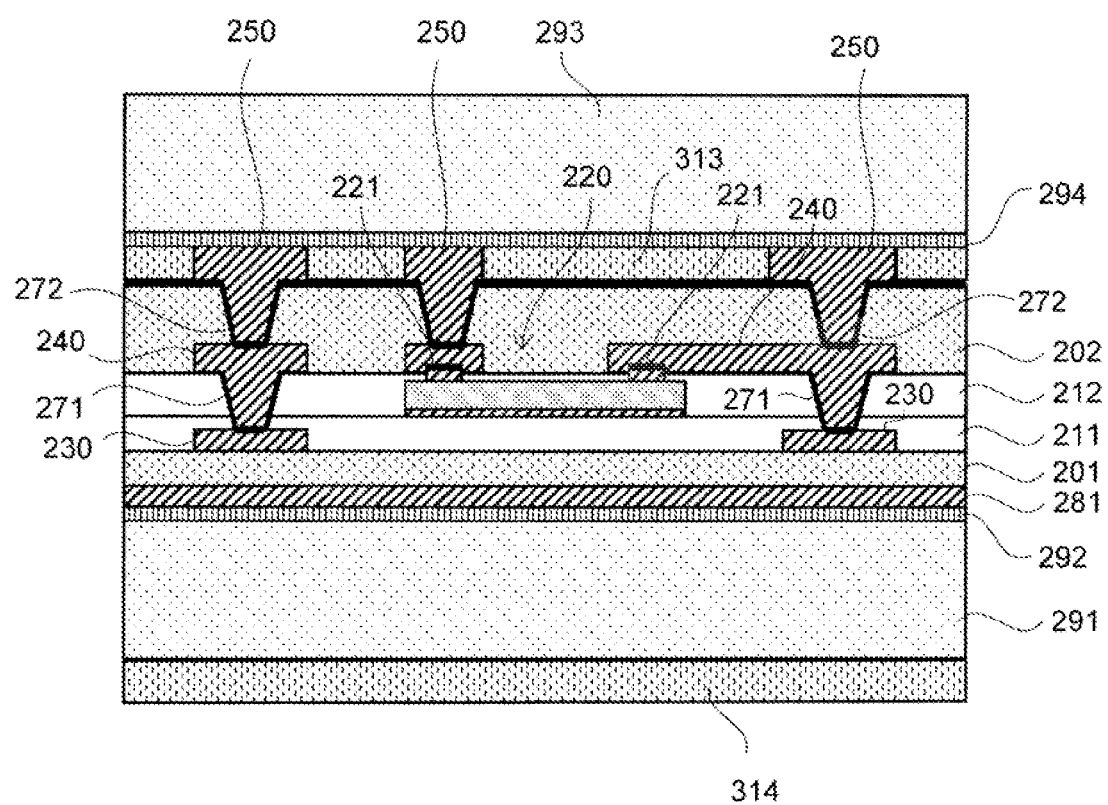
FIG. 54 is process diagram showing a process of affixing a support substrate that is a part of the manufacturing process of the multilayer circuit board shown in FIG. 34.
Figure 55:
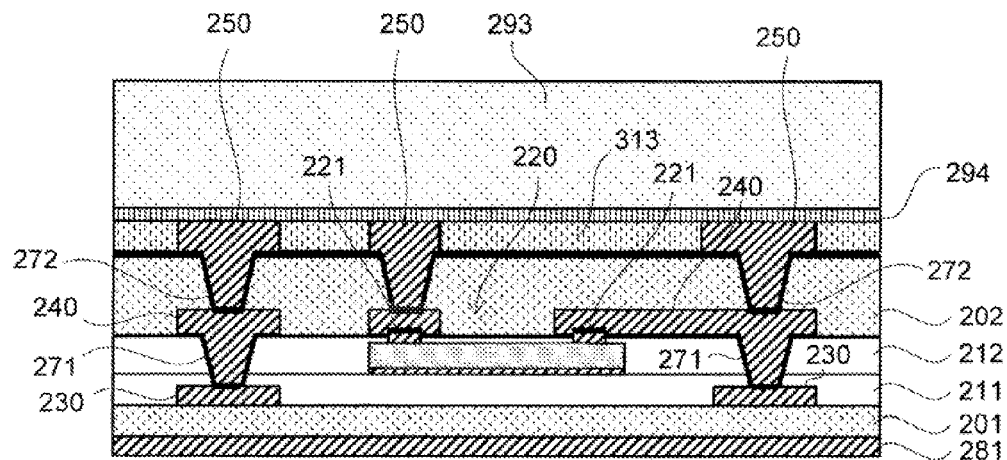
FIG. 55 is process diagram showing a process of peeling off a support substrate that is a part of the manufacturing process of the multilayer circuit board shown in FIG. 34.

Then, as shown in FIG. 54, another support substrate 293 is attached on the opposite side of the semiconductor IC 220 to the support substrate 291. Here again, a hear release sheet 294 is used to attach the support substrate 293. After the other support substrate 293 is attached in this way, the support substrate 291 that is attached earlier is released as shown in FIG. 55. The support substrate 291 is released by heating the neat release sheet 292.

Also in this embodiment, the heat release sheets 292 and 294 satisfying the following expression can be used in which T1 is the release temperature of the heat release sheet 292 and T2 is the release temperature of the heat release sheet 294:

$$T1 < T2.$$

A temperature Tx applied to release the support substrate 291 is set for:

$$T1 \leq Tx < T2.$$

Figure 56:
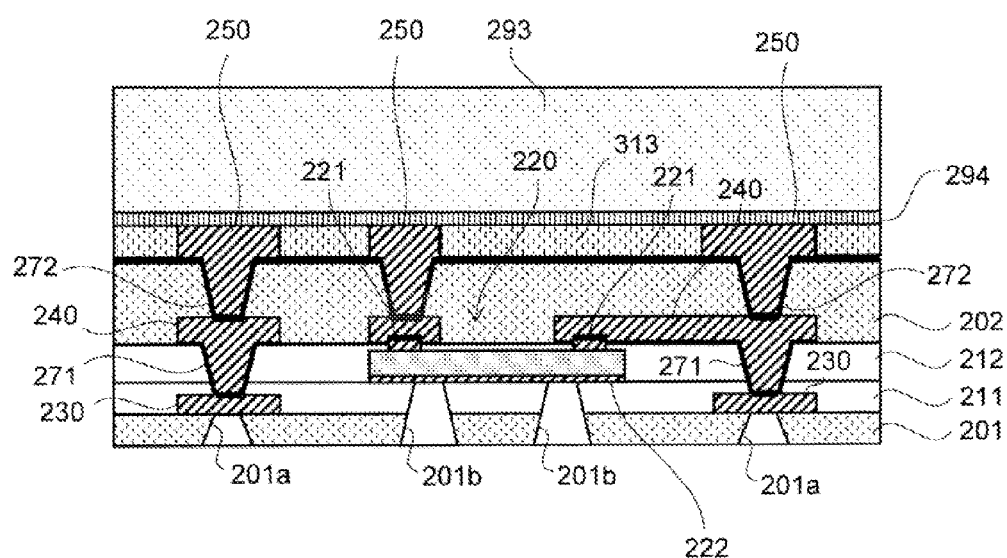
FIG. 56 is process diagram showing a process of forming through-holes that is a part of the manufacturing process of the multilayer circuit board shown in FIG. 34.

Then, as shown in FIG. 56, through-holes 201a and 201b are formed in the core layer 201 using laser irradiation after the conductive layer 281 is removed or thinned. The through-holes 201a penetrate the core layer 201 to expose the alignment marks 230 and the through-holes 201b penetrate the core layer 201 to expose the metal layer 222 on the rear surface of the semiconductor IC 220.

Figure 57:
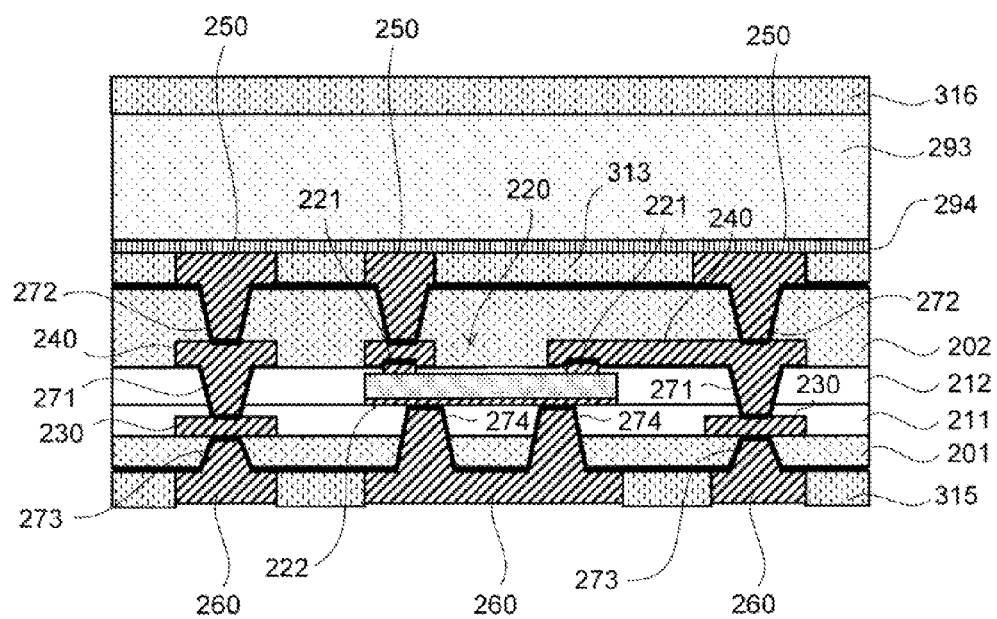
FIG. 57 is process diagram showing a process of forming a wiring pattern that is a part of the manufacturing process of the multilayer circuit board shown in FIG. 34.

Then, the manufacturing processes described with reference to FIGS. 44 to 46 or FIGS. 51 to 53 are repeated to form an outermost wiring pattern 260 as shown in FIG. 57. In this process, the through-holes 201a are filled with the through electrodes 273, whereby the wiring pattern 260 and the alignment marks 230 are connected. On the other hand, the through-holes 201b are filled with the through electrodes 274, whereby the wiring pattern 260 and the metal layer 222 are connected. The through electrodes 274 serve as thermal vias so that heat generated by the semiconductor IC 220 is effectively transferred to outside.

Then, the heat release sheet 294 is heated to the release temperature T2 or higher to release the support substrate 293 attached later together with the dry film 316 and remove unnecessary dry film 313 and 315 so as to complete the multilayer circuit board 200 shown in FIG. 34.

As described above, also in this embodiment, the manufacturing processes proceed with the core layer 201 being immobilized on the support substrate 291 and the core layer 202 being immobilized on the support substrate 293. Therefore, the distortion that occurs in the course of processing can be minimized even though the core layers 201 and 202 have a much smaller thickness than usual. Consequently, semiconductor ICs having small electrode pitches can be embedded.

Effects of the immobilization of the core layers 201 and 202 on the support substrates 291 and 293 are described in detail hereafter.

Figure 58:
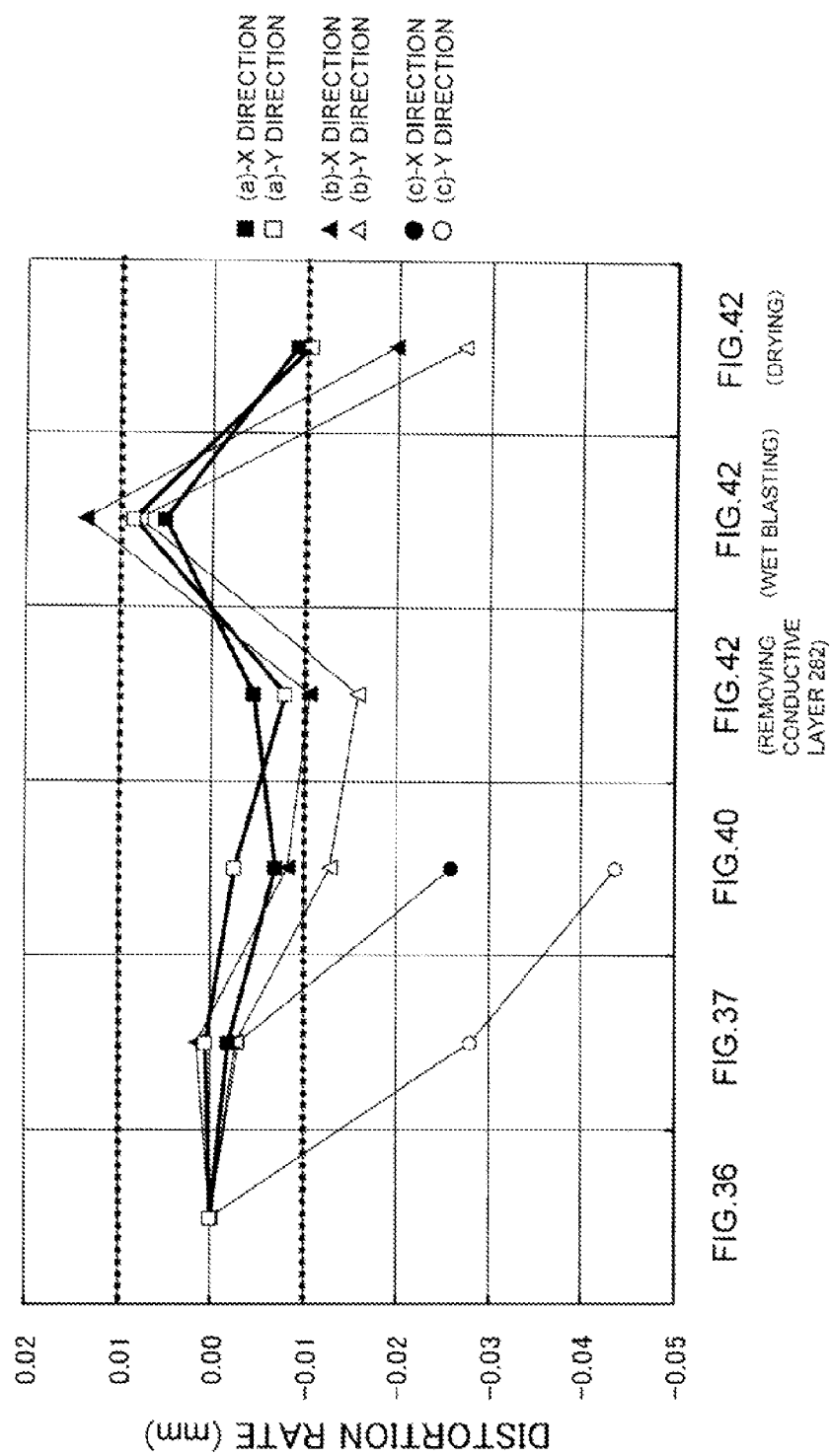
FIG. 58 is a graphical representation showing the distortions in the directions X and Y of the core layer through the steps shown in FIGS. 36 to 42.

FIG. 58 is a graphical representation showing the distortions in the directions X and Y of the core layer 201 through the steps shown in FIGS. 36 to 42 (a) when the core layer 201 is immobilized on the support substrate 291 as in this embodiment, (b) when the core layer 201 is not immobilized on the support substrate 291 (the conductive layer 281 on the back is not released), and (c) when the core layer 201 is not immobilized on the support substrate 291 (the conductive layer 281 on the back is released).

Figure 59:
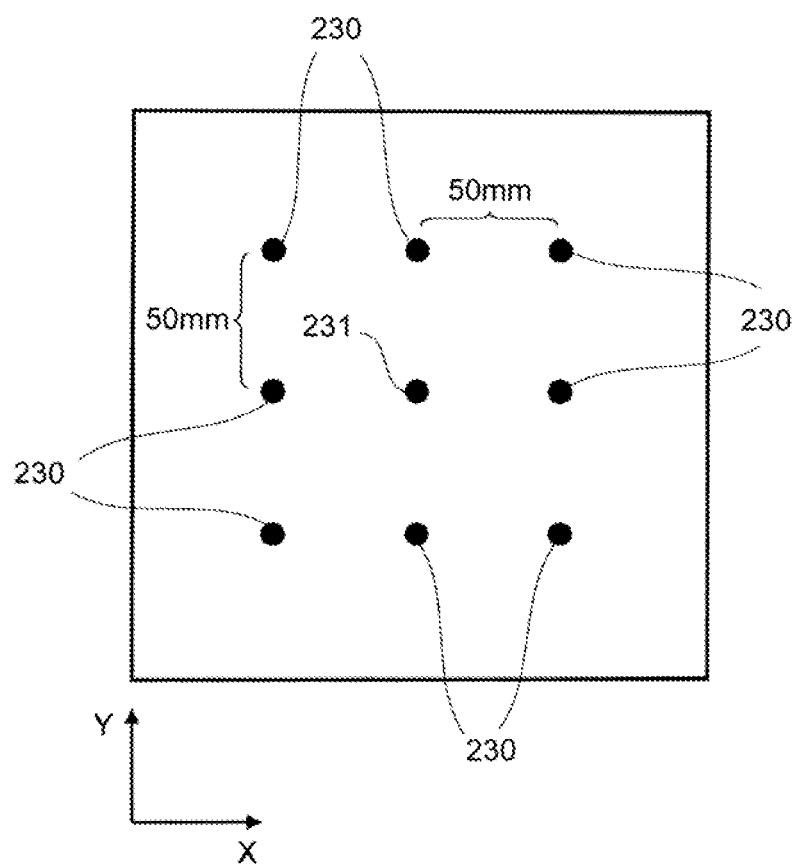
FIG. 59 is a drawing which explains a method for defining the deformation amount of the core layer.

In all cases, the core layer 201 was made of a nonwoven aramid cloth as a core material impregnated with epoxy resin. The core layer 201 had a thickness of 50 μm. As shown in FIG. 59, eight alignment marks 230 were formed around the origin 231 at 50 mm intervals. The distortion rates (changes in measures) were determined by their shifts (on average) from the design values in the directions X and Y.

As shown in FIG. 58, the core layer 201 was subject to obvious deformation while absorbing water and dried in the step of wet blasting. When the core layer 201 was immobilized on the support substrate 291 as in this embodiment, the distortion rates did not exceed 0.01 mm (the distortion rate 0.02%). Conversely, When the core layer 201 was not immobilized on the support substrate 291, the distortion rates exceeded 0.01 mm. The distortion depressing effect was also observed when the conductive layer 281 on the back was not released. However, larger deformation was observed while absorbing water and dried when only the conductive layer 281 was present. In this case, smaller electrode pitches cannot be used.

In this way, this embodiment minimize the distortion that occurs in the thin core layer and allows semiconductor ICs having small electrode pitches to be embedded.

The support substrates 291 and 293 also offer improved handling ability during the processes, thereby reducing breaking and cracking of the board and loads on the semiconductor IC 220 due to deformation.

In this embodiment, the stud bumps 221 are exposed by reducing the thickness of the resin layer 212 using, for example, wet blasting. Therefore, the heads of the stud bumps 221 are properly exposed even if the electrode pitches are small. In addition, the head exposure of the stud bumps 221 takes only a short time regardless of the number of the stud bumps 221. Furthermore, no smear occurs as in the case very small vias are formed using laser irradiation. Therefore, desmear treatment can be eliminated.

In this embodiment, wet blasting is used to expose the heads of the stud bumps 221. The etching rate and conditions are adjusted to protrude the stud bumps 212 from the surface of the resin layer 212. Therefore, the base conductor layer 241 can be formed without pre-treatments such as removal of etching residue.

The semiconductor IC 220 is positioned using the alignment marks 230 formed on the surface of the core layer 201, thereby achieving the mounting positions with high accuracy.

The thickness t of the semiconductor IC 220 in this embodiment is significantly reduced by abrasion. Consequently, the entire multilayer circuit board 200 can have a significantly small thickness of, for example, 200 μm.

The present invention is in no way limited to the aforementioned embodiments, but rather various modifications are possible within the scope of the invention as recited in the claims, and naturally these modifications are included within the scope of the invention.

Figure 17:
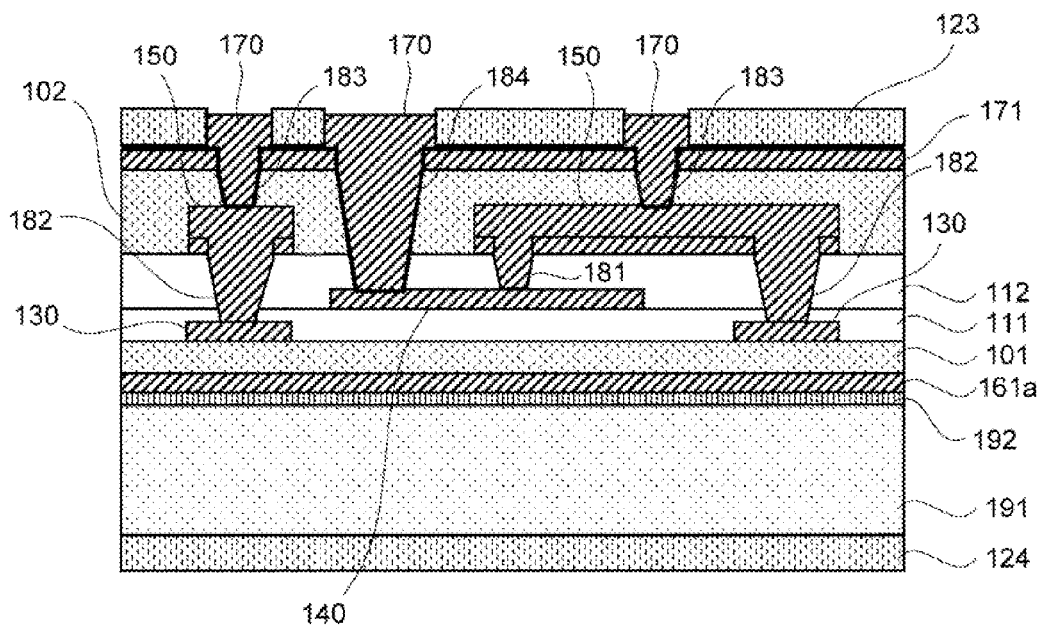
FIG. 17 is process diagram showing a process of forming a wiring pattern that is a part of the manufacturing process of the multilayer circuit board shown in FIG. 1.

For example, the support substrates are replaced in the steps shown in FIGS. 17 to 19 in the first embodiment and in the steps shown in FIGS. 53 to 55 in the second embodiment. This replacement of the support substrates is not essential for the present invention. In other words, the support substrate 191 is released after the step shown in FIG. 17 or 53 and the subsequent processes can be performed with no support substrate when relatively large distortion is tolerated. However, with the replacement of the support substrates as in the above embodiments, the immobilization on a support substrate is assured until the last process, whereby the distortion can be minimized.

Figure 60:
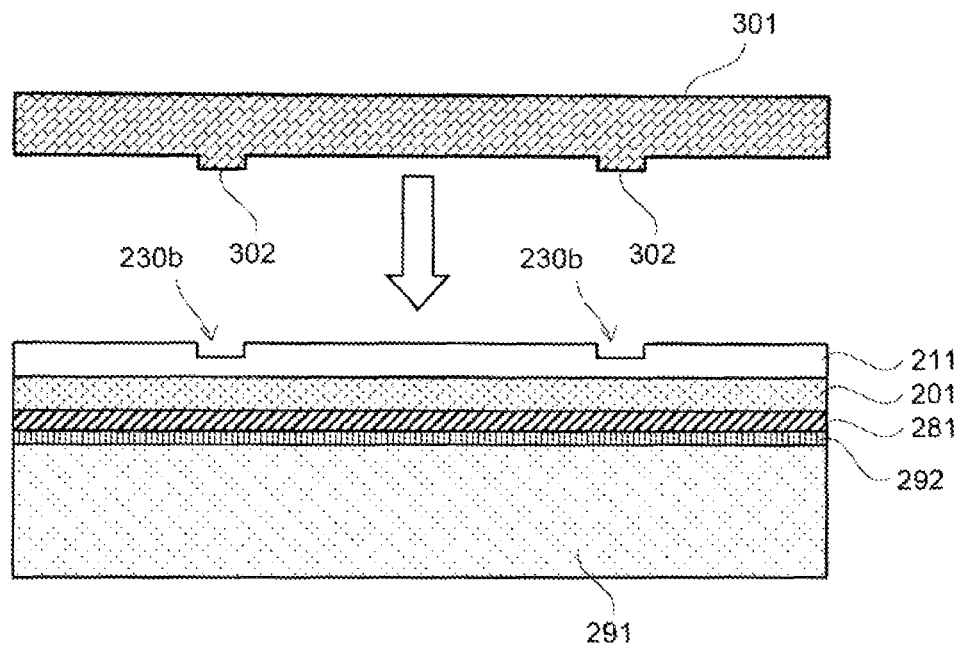
FIG. 60 is a drawing which explains a method for forming recesses in the resin layer.
Figure 61:
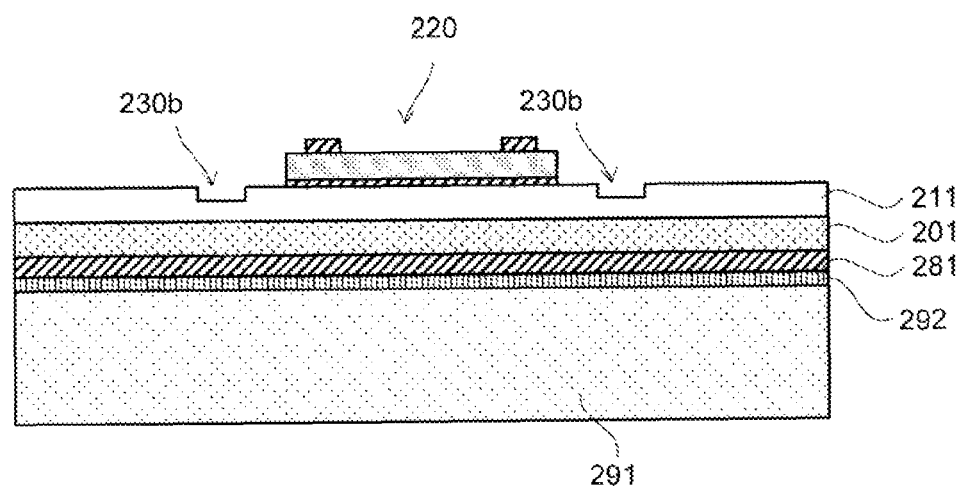
FIG. 61 is a drawing which shows the semiconductor IC in the mounted state, with the recesses formed on the resin layer serving as an alignment mark.

In the second embodiment, the alignment marks are conductive patterns. However, the alignment marks are not restricted to conductive patterns and recesses formed in the resin or core layer can be used as the alignment marks. For example, recesses 230b are formed in the core layer 201 using a metal mold 301 having protrusions 302 as shown in FIG. 60. Then, as shown in FIG. 61, these recesses 230b can be used as the alignment marks to mount the semiconductor IC 220.

Figure 62:
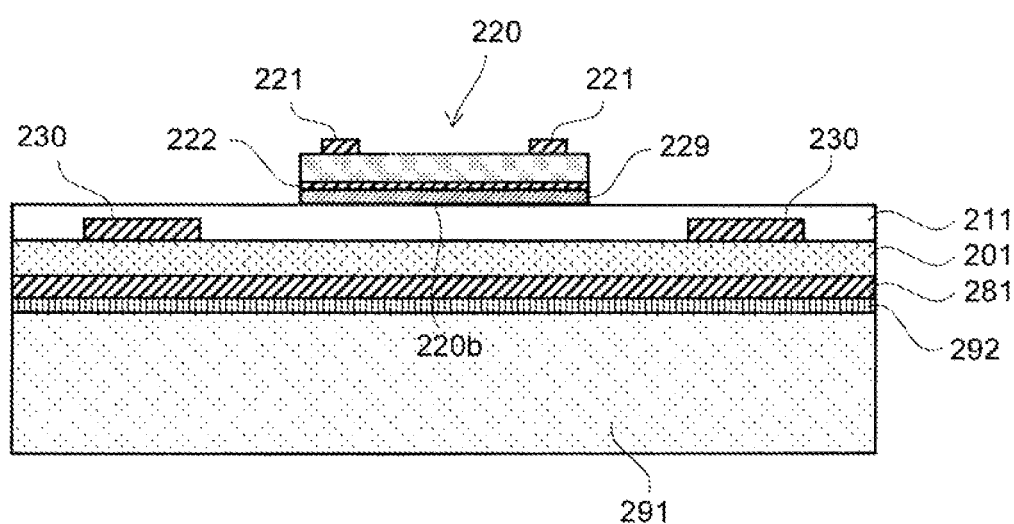
FIG. 62 is a drawing which shows the semiconductor IC mounted on resin layer through a die attach film.

Furthermore, the semiconductor IC 220 is mounted directly on the resin layer 211 in the second embodiment. However, the semiconductor IC 220 can be provided with a die attach film and mounted on the resin layer 211 via the die attach film. For example, as shown in FIG. 62, the semiconductor IC 220 can be provided with a die attach film 229 on the rear surface and temporarily attached to the resin layer 211 by bonding the die attach film 229 and resin layer 211. In such a case, the resin layer 211 does not need to exhibit adhesion. In the example shown in FIG. 62, the die attach film 229 is present between the rear surface 220b of the semiconductor IC 220 and the resin layer 211; therefore, they are not in direct contact. The rear surface 220b of the semiconductor IC 220 is covered with the rein layer 211 via the die attach film 229.

What is claimed is:

1. A method for manufacturing a multilayer circuit board, comprising: a first step of immobilizing a first core layer with a first support substrate, the first core layer being formed to have a single-layered thickness of 100 μm or smaller and being made of a core material impregnated with resin, prior to performing the following steps; a second step of forming at least one resin layer on the first core layer, in which wiring patterns are embedded in the resin layer; and a third step of forming a second core layer to have a single-layered thickness of 100 μm or smaller and being made of a core material impregnated with resin, the second core layer being formed on the resin layer and opposing the first core layer.

2. The method for manufacturing a multilayer circuit board as claimed in claim 1, wherein the first support substrate and the first core layer are attached to each other by a first heat release sheet.

3. The method for manufacturing a multilayer circuit board as claimed in claim 1, further comprising a fourth step of forming through-holes in the first core layer.

4. The method for manufacturing a multilayer circuit board as claimed in claim 3, wherein the fourth step is performed after the first support substrate is detached.

5. The method for manufacturing a multilayer circuit board as claimed in claim 3, wherein the fourth step is performed before the second step.

6. The method for manufacturing a multilayer circuit board as claimed in claim 1, further comprising a step of forming through-holes in the second core layer after the third step.

7. The method for manufacturing a multilayer circuit board as claimed in claim 1, further comprising steps of
immobilizing the second core layer on a second support substrate before the first support substrate is detached from the first core layer; and
removing the first support substrate before removing the second support substrate.

8. The method for manufacturing a multilayer circuit board as claimed in claim 7, wherein the second support substrate and the second core layer are attached to each other by a second heat release sheet, the second heat release sheet has a higher release temperature than the first heat release sheet.

9. The method for manufacturing a multilayer circuit board as claimed in claim 1, wherein a semiconductor IC is embedded in the resin layer in the second step.

10. The method for manufacturing a multilayer circuit board as claimed in claim 9, wherein the second step includes:
forming a first resin layer on the first core layer;
mounting the semiconductor IC on the first resin layer with its rear surface facing the first resin layer;
forming a second resin layer to cover a main surface of the semiconductor IC; and
reducing the thickness of the second resin layer so that conductive protrusions formed on the main surface of the semiconductor IC protrude from a surface of the second resin layer, wherein a boundary of the first core layer and the first resin layer is formed to be substantially flat, and the conductive protrusions protrude from the boundary.

11. A method for making a multilayer circuit board, comprising: forming a plurality of resin layers parallel with each other and at least in part one on top of another; forming a single-layer first core layer to a thickness of 100 μm or smaller, on one side of and parallel with the plurality of resin layers, the first core layer made to be more strong than any one of the plurality of resin layers; forming a second core layer to a single-layer thickness of 100 μm or smaller on a side of the plurality of resin layers opposite to the first core layer, the second core layer made to be more strong than any one of the plurality of resin layers; and forming a first wiring pattern embedded in the plurality of resin layers, wherein the plurality of resin layers are interposed between the first and second core layers and the first core layer having been formed to a thickness of 100 μm or smaller so as to provide the multilayer circuit board of a smaller thickness than previously possible, and whereby the multilayer circuit board has increased strength beyond that of a plurality of less strong resin layers.

12. The method of claim 11, further comprising the step of immobilizing the first core layer with a first support substrate prior to forming the plurality of resin layers, forming the second core layer, or forming the first wiring pattern, and wherein the first core layer or the second core layer has been formed to a thickness of 100 μm or smaller and does not experience deformation during assembly of the multilayer circuit board, so that the entire multilayer circuit board can significantly be thinned.

13. The method of claim 11, wherein both of the first core layer and the second core layer are impregnated with resin, are formed to a thickness of 100 μm or smaller, and have single-layered structure.

14. The method of claim 11, further comprising the step of:
forming a temporary first support substrate to immobilize the first core layer during manufacturing of the multilayer circuit, wherein the temporary first support substrate is removed before the multilayer circuit board is complete.

15. The method of claim 14, further comprising the step of:
forming a first heat release sheet that attaches the temporary first support substrate and the first core layer, so as to immobilize the first core layer, wherein the first heat release sheet enables the removal of the temporary first support substrate before the multilayer circuit board is complete.

16. The method of claim 11, further comprising the step of:
embedding a semiconductor IC within the plurality of resin layers.

17. A method for making a multilayer circuit board, comprising: forming a first core layer including a core material impregnated with resin; forming a temporary first support substrate coupled to and immobilizing the first core layer prior to performing the following steps; forming a first resin layer formed on at least a portion of the first core layer; forming a second resin layer on at least a portion of the first resin layer; forming a wiring pattern within the first resin layer and the second resin layer; and forming a second core layer including a core material impregnated with resin and formed on the second resin layer, wherein both the first core layer and the second core layer has been formed to a single-layered thickness of 100μm or smaller and does not experience deformation during assembly of the multilayer circuit board, so that an entire completed multilayer circuit board can be significantly thinner than previously possible.

18. The method as claimed in claim 17, further comprising:
forming through-holes in the first core layer;
forming through-holes in the second core layer;
embedding a semiconductor IC in the resin layers, wherein the temporary first support substrate and the first core layer are attached to each other by a first heat release sheet, and wherein the second core layer does not experience deformation during assembly of the multilayer circuit board, so that an entire completed multilayer circuit board can significantly be thinned.

19. The method as claimed in claim 18, further comprising the step of:
detaching the temporary first support substrate from the first core layer by heat.

20. The method as claimed in claim 19, further comprising the steps of:
forming a temporary second support substrate coupling to and immobilizing the second core layer the step immediately before the temporary first support substrate is detached from the first core layer wherein the temporary second support substrate and the second core layer are attached to each other by a second heat release sheet, and the second heat release sheet has a higher release temperature than the first heat release sheet; and subsequently
detaching the temporary second support substrate from the second core layer by heat so as to leave the multilayer circuit board free standing of the temporary first support substrate and the temporary second support substrate.

* * * * *